United States Patent
Stadler et al.

(10) Patent No.: US 12,300,591 B2
(45) Date of Patent: May 13, 2025

(54) DEVICES WITH CONDUCTIVE OR MAGNETIC NANOWIRES FOR LOCALIZED HEATING AND CONNECTION

(71) Applicant: Regents of the University of Minnesota, Minneapolis, MN (US)

(72) Inventors: Bethanie J Stadler, Shoreview, MN (US); Rhonda R. Franklin, Falcon Heights, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 232 days.

(21) Appl. No.: 18/151,250

(22) Filed: Jan. 6, 2023

(65) Prior Publication Data
US 2023/0223324 A1    Jul. 13, 2023

Related U.S. Application Data

(60) Provisional application No. 63/266,551, filed on Jan. 7, 2022.

(51) Int. Cl.
*H05K 1/18* (2006.01)
*H01L 21/48* (2006.01)
(Continued)

(52) U.S. Cl.
CPC ...... *H01L 23/49827* (2013.01); *H01L 21/486* (2013.01); *H01L 23/5384* (2013.01); *H01L 24/13* (2013.01); *H01L 24/16* (2013.01); *H01L 24/81* (2013.01); *H01R 12/52* (2013.01); *H05K 1/145* (2013.01); *H05K 1/181* (2013.01); *H05K 3/0014* (2013.01); *H05K 3/3436* (2013.01); *H05K 3/3494* (2013.01); *H05K 3/368* (2013.01); *H05K 3/424* (2013.01); *H01L 2224/13109* (2013.01); *H01L 2224/13111* (2013.01); *H01L 2224/13118* (2013.01); *H01L 2224/1312* (2013.01); *H01L 2224/13138* (2013.01); *H01L 2224/13139* (2013.01); *H01L 2224/13147* (2013.01); *H01L 2224/16235* (2013.01); *H01L 2224/81192* (2013.01);
(Continued)

(58) Field of Classification Search
CPC ...... H05K 1/145; H05K 1/181; H05K 3/0014; H05K 3/3436; H05K 3/3494; H05K 3/368; H05K 3/424; H01L 2224/13109
USPC .......................................... 361/760
See application file for complete search history.

(56) References Cited

U.S. PATENT DOCUMENTS

2006/0249070 A1* 11/2006 Morrison ............ H10N 30/077
117/2
2012/0301743 A1* 11/2012 Walker ................. B22D 19/08
977/890

OTHER PUBLICATIONS

Alonso et al., "FeCo Nanowires with Enhanced Heating Powers and Controllable Dimensions for Magnetic Hyperthermia," Journal of Applied Physics, vol. 117, No. 17, Feb. 2015, 4 pp.
(Continued)

*Primary Examiner* — Binh B Tran
(74) *Attorney, Agent, or Firm* — Shumaker & Sieffert, P.A.

(57) ABSTRACT

A device includes a porous substrate that include a plurality of pores and a plurality of nanodevices dispersed in at least a portion of the plurality of pores. Each of the plurality of nanodevices includes a magnetic nanowire and a solder nanoparticle. The magnetic nanowires are configured to generate heat in response to an alternating magnetic field. The solder nanoparticles are configured to receive a portion of the heat and reflow to connect to one or more devices or surfaces.

20 Claims, 10 Drawing Sheets

(51) Int. Cl.
  H01L 23/00    (2006.01)
  H01L 23/498   (2006.01)
  H01L 23/538   (2006.01)
  H01R 12/52    (2011.01)
  H05K 1/14     (2006.01)
  H05K 3/00     (2006.01)
  H05K 3/34     (2006.01)
  H05K 3/36     (2006.01)
  H05K 3/42     (2006.01)
(52) U.S. Cl.
  CPC ............... H01L 2224/81222 (2013.01); H01L 2224/81815 (2013.01); H01L 2924/01014 (2013.01); H05K 2201/10378 (2013.01); H05K 2203/0723 (2013.01)

(56) References Cited

OTHER PUBLICATIONS

Bakoglu et al., "Optimal Interconnection Circuits for VLSI," IEEE Transactions on Electron Devices, vol. ED-32, No. 5, May 1985, pp. 903-909.
Banerjee et al., "3-D ICs: A Novel Chip Design for Improving Deep-Submicrometer Interconnect Performance and Systems-on-Chip Integration," Proceedings of the IEEE, vol. 89, No. 5, May 2001, pp. 602-633.
Bohr et al., "Technology for Advanced High-Performance Microprocessors," IEEE Transactions on Electron Devices, vol. 45, No. 3, Mar. 1998, pp. 620-625.
Bohr, "Interconnect Scaling—The Real Limiter to High Performance ULSI," Proceedings of International Electron Devices Meeting, Dec. 1995, pp. 241-244.
Cho et al., "Interconnect Capacitance, Crosstalk, and Signal Delay for 0.35 um CMOS Technology," International Electron Device Meeting Technical Digest, Dec. 1996, pp. 619-622.
Dang et al., "Coupling Capacitance for Two-Dimensional Wires," IEEE Electron Device Letters, vol. EDL-2, No. 8, Aug. 1981, pp. 196-197.
Das et al., "Tunable High Aspect Ratio Iron Oxide Nanorods for Enhanced Hyperthermia," The Journal of Physical Chemistry C, vol. 120, No. 18, Apr. 2016, pp. 10086-10093.
Davari et al., "CMOS Scaling for High Performance and Low Power—The Next Ten Years," Proceedings of the IEEE, vol. 83, No. 4, Apr. 1995, pp. 595-606.
Davis et al., "Interconnect Limits on Gigascale Integration (GSI) in the 21st Century," Proceedings of the IEEE, vol. 39, No. 3, Mar. 2001, pp. 305-324.
Gardner et al., "Interconnection and Electromigration Scaling Theory," IEEE Transactions on Electronic Devices, vol. ED-34, No. 3, Mar. 1987, pp. 633-643.
Geng et al., "Anisotropic Magnetite Nanorods for Enhanced Magnetic Hyperthermia," Chemistry—An Asian Journal, vol. 11, No. 21, Sep. 2016, pp. 2996-3000.
International Roadmap of Devices and Systems, IEEE, 2021 (Applicant points out, in accordance with MPEP 609.04 (a), that the year of publication, 2021, is sufficiently earlier than the effective U.S. filing date, so that the particular month of publication is not in issue.) 64 pp.
Kapur et al., "Technology and Reliability Constrained Future Copper Interconnects—Part I: Resistance Modeling," IEEE Transactions on Electron Devices, vol. 49, No. 4, Apr. 2002, pp. 590-597.
Kapur et al., "Technology and Reliability Constrained Future Copper Interconnects—Part II: Performance Implications," IEEE Transactions on Electron Devices, vol. 49, No. 4, Apr. 2002, pp. 598-604.
Lin et al., "Shape Effects of Iron Nanowires on Hyperthermia Treatment," Journal of Nanomaterials, vol. 2013, No. 1-3, Jan. 2013, 6 pp.
Loke, "Process Integration Issues of Low-Permittivity Dielectrics with Copper for High-Performance Interconnects," PhD Thesis, Stanford University, Mar. 1999, 17 pp.
Maqableh et al., "Low-Resistivity 10 nm Diameter Magnetic Sensors," Nano Letters, vol. 12, Jul. 2012, pp. 4102-4109.
Oh et al., "2001 Needs for Multi-Level Interconnect Technology," IEEE Circuits and Devices, vol. 11, No. 1, Jan. 1995, pp. 16-21.
Saraswat et al., "Effect of Scaling of Interconnections on the Time Delay of VLSI Circuits," IEEE Transactions on Electron Devices, vol. ED-29, No. 4, Apr. 1982, pp. 645-650.
Sharma et al., "Patterned Metallic Nanowire Arrays Based Flip Chip Interconnects," 2008 10th Electronics Packaging Technology Conference, Dec. 2008, 6 pp.
Sharma et al., "Patterned Micropads Made of Copper Nanowires on Silicon Substrate for Application as Chip to Substrate Interconnects," Nanotechnology, vol. 18, No. 30, Jun. 2007, 5 pp.
Shore et al., "Nanowarming Using Au-tipped Co35Fe65 Ferromagnetic Nanowires," Nanoscale, vol. 11, No. 6, Aug. 2019, 9 pp.
Stamper et al., "Intermetal Dielectrics—A Five Year Outlook," Proc. of Diel. for ULSI Multilevel Inter. Conf, Feb. 10-11, 1997, 7 pp.
Yi et al., "Electromigration-Induced Integration Limits on the Future ULSI's and the Beneficial Effects of Lower Operation Temperatures," IEEE Transactions on Electron Devices, vol. 42, No. 4, Apr. 1995, pp. 683-688.
Zhang et al., "Permeability and Ferromagnetic Resonance Study for Magnetic Nanowires Substrate With Copper Layer," IEEE Microwave and Wireless Component Letters, vol. 30, No. 11, Nov. 2020, pp. 1065-1068.

* cited by examiner

DEVICES WITH CONDUCTIVE OR MAGNETIC NANOWIRES FOR LOCALIZED HEATING AND CONNECTION This application claims the benefit of U.S. Provisional Patent Application Ser. No. 63/266,551, entitled "DEVICES WITH CONDUCTIVE OR MAGNETIC NANOWIRES FOR LOCALIZED HEATING AND CONNECTION" and filed Jan. 7, 2022, the entire contents of which is incorporated herein by reference.

GOVERNMENT RIGHTS

This invention was made with government support under FA9550-21-1-0273 awarded by the Air Force Office of Scientific Research. The government has certain rights in the invention.

TECHNICAL FIELD

The disclosure relates to heating and conductive devices.

BACKGROUND

A challenge in scaling electronics from microscale to nanoscale is increased resistivity of interconnects. Electrons that carry information in microelectronic systems experience scattering due to thermal perturbations in the atomic space that they traverse. This scattering increases dramatically as electronics scale down to nano dimensions, as the electrons are more likely to collide with interconnect sidewalls.

SUMMARY

This disclosure describes fabrication and operation of electronic nanostructures in porous substrates. A device includes a porous substrate and nanowires dispersed in pores of the porous substrate. The pores of the porous substrate may have a small diameter, such as less than about 20 nanometers, and a relatively narrow size distribution. The porous substrate may function as a platform for forming the nanowires and positioning the nanowires relative to a surface of the device. For example, the nanowires may be electrodeposited in the pores, resulting in relatively low resistivity nanowires having a corresponding small diameter and small size, orientation, and spacing distribution. The pores may further include solder nanodots at the surface of the nanowires having correspondingly small dimensions. The location of the nanowires in the porous substrate may be controlled by depositing and growing the porous substrate on particular portions of a base substrate, such as a patterned electrode, selectively applying photoresist or other blocking material to close off particular pores or groups of pores, and growing the nanowires in the remaining open pores. As a result, the device may include nanowires having relatively low resistivity and present at particular locations, such that the nanowires are capable of functioning as interconnects between electronic devices.

In some examples, the device may be configured to form nanodevices for characterization for or use in other systems. For example, multilayered nanodevices may be formed in the pores of the porous substrate by sequentially depositing different materials in the pores of the porous substrate. As one example, a nanodevice may include a nanowire and magnetic ends on the nanowire. When dispersed across a surface, the magnetic ends may aid in alignment of the nanodevice, such as between different electrodes for measuring electrical properties of the nanodevice. As another example, a nanodevice may include ferromagnetic and conductive layers that form magnetoresistive elements. In these various ways, a porosity of the porous substrates may be utilized to form relatively small nanodevices.

In some examples, the device may be configured with magnetic nanowires to provide local heating of electronic nanostructures using alternating magnetic fields. When exposed to an alternating magnetic field, the magnetic nanowires convert electromagnetic energy to heat due to internal friction within the magnetic nanowires created by the alternating magnetic current. Various physical and material properties of the magnetic nanowires, such as a small diameter, high aspect ratio, and high magnetic anisotropic, characterize a corresponding hysteresis loop that enables relatively fast heating of the magnetic nanowires.

The heat generated by the magnetic nanowires may be used for a variety of applications. In some examples, the heat generated from the device may be used to connect the device to another electronic device through reflow and subsequent electrical connection to solder. In response to heat induced by the alternating magnetic field, the magnetic nanowires may transfer the heat to solder nanoparticles positioned above the magnetic nanowires at the surface of the device to selectively reflow the solder nanoparticles without the use a solder oven. The solder nanoparticles on the magnetic nanowires may extend from a surface of the device to contact a contact pad or other connector of the electronic device. Such contact may be used to connect nanodevices to devices having substantially larger size and/or complexity, thereby enabling devices of multiple different scales to be directly coupled together.

In some examples, the heat generated from the device may be digitized to discretely connect the device to other electronic devices or groups of electronic devices. An alternating magnetic field may be characterized by a field amplitude and a frequency. In digitized heating, a particular nanowire may only generate heat in response to a magnetic field once a switching threshold magnetic field amplitude has been reached. For example, a magnetic field having the threshold magnetic field amplitude, when applied to the nanowire, may cause the nanowire to exhibit digital heating between an "on" state and an "off" state as that particular nanowire is switched while other nanowires are not switched. The heat produced by that particular nanowire will be proportional to the frequency of the alternating magnetic field.

To create multiple different states, the device may include nanowires having different compositions, diameters, and shapes that are characterized by different threshold magnetic field amplitudes. For example, a first nanowire in the device may exhibit digital heating between "on" state and an "of" state in response to a magnetic field having a first threshold magnetic field amplitude being applied to the first nanowire, and a second nanowire in the device may exhibit digital heating between "on" state and an "of" state in response to a magnetic field having a second threshold magnetic field amplitude being applied to the second nanowire. As a result, the device may enable tiered heating of nanowires or groups of nanowires based on an amplitude of the alternating magnetic field. For example, a high amplitude magnetic field may be used to heat a first set of nanowires having a high threshold magnetic field amplitude, along with a second set of nanowires having a low threshold magnetic field amplitude, to connect a first set of devices to the first set of nanowires. Subsequently, a low amplitude magnetic field may be used to heat the second set of nanowires, without heating the first set of nanowires, to connect a second set of devices to the second set of nanowires.

In some examples, the heat generated from the device may be used to position and probe nanodevices positioned on the surface of the device. For example, nanodevices may be spread across the surface of the device and selectively probed to measure electrical properties of the nanodevices. The heat generated from the device may reflow solder nanodots on the nanowires in the device, such that the solder contacts and provides robust electrical connections between the conductive nanowires and the nanodevices. As described above, to position the nanodevices between particular magnetic nanowires, portions of the nanodevices may be temporarily or permanently magnetized to "click" the nanodevices into place on the surface of the device and ensure contact between the nanodevices and the magnetic nanowires. In these various ways, thermal properties of the magnetic nanowires may be exploited to generate heat and utilize the heat for a variety of purposes in nano- or micro-devices.

The details of one or more examples are set forth in the accompanying drawings and the description below. Other features, objects, and advantages will be apparent from the description and drawings, and from the claims.

DETAILED DESCRIPTION

This disclosure describes electronic nanostructures, including fabrication of low resistivity, highly controllable electronic nanostructures and local heating of electronic nanostructures using alternating magnetic fields.

Figure 1:
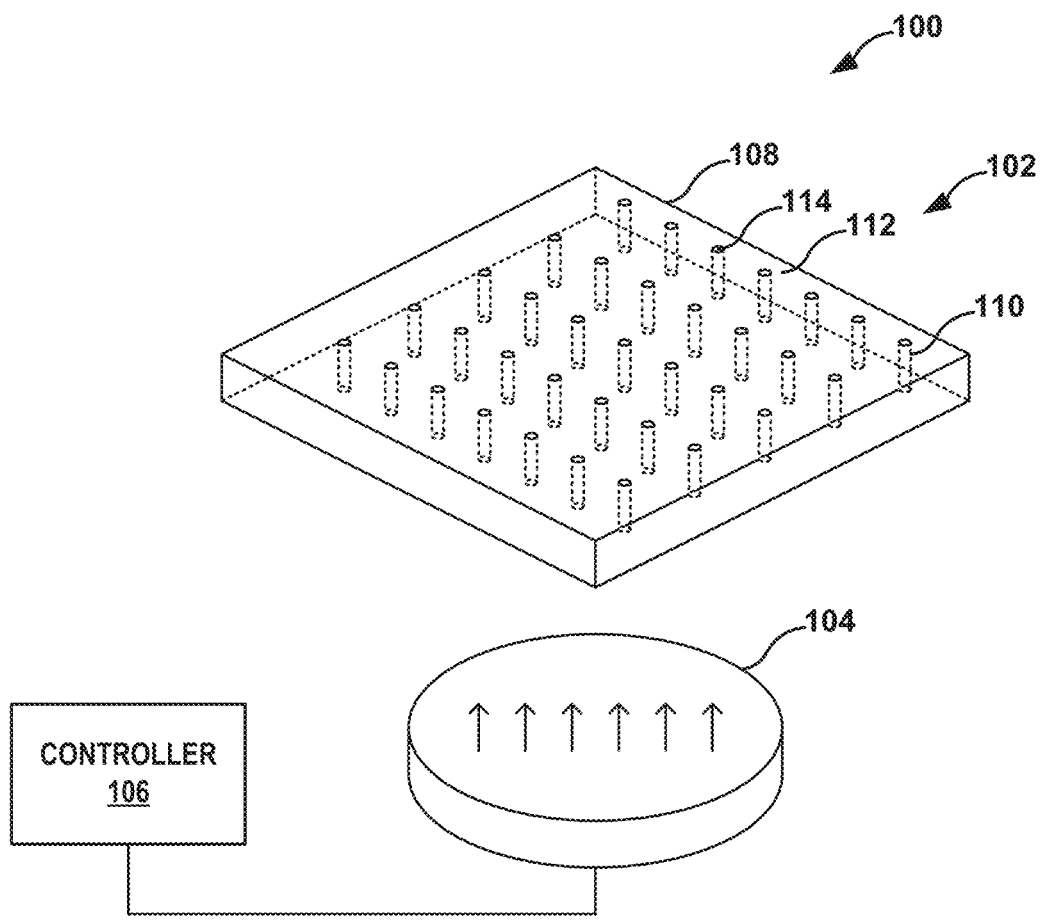
FIG. 1 is a schematic conceptual diagram illustrating an example system according to techniques described herein.

FIG. 1 is a schematic conceptual diagram illustrating an example system 100 according to techniques described herein. System 100 includes device 102. Device 102 includes a porous substrate 108 that includes a plurality of pores 110. The plurality of pores 110 may extend from a bottom surface of porous substrate 108 to a top surface 112 of porous substrate 108. While not shown, the bottom surface of porous substrate 108 may be coupled to another substrate, such as a heat sink, patterned electrode, or other substrate configured to thermally or electrically interface with device 102. In some examples, porous substrate 108 may be configured to couple to an electronic device. For example, porous substrate 108 may be directly coupled to an electronic device, or may be coupled indirectly through an adhesive.

The plurality of pores 110 of porous substrate 108 may function as a template for both forming electronic and/or thermal nanostructures of device 102 and positioning (e.g., aligning, orienting, and spacing) the electronic and/or thermal structures with respect to a surface of porous substrate 108 and other electronic and/or thermal nanostructures. As will be described further below, a diameter of the nanowires, and corresponding a diameter of the plurality of pores 110, may be selected based on heating requirements and fabrication circumstances, such as lowest fabrication complexity and lowest integration complexity. The plurality of pores 110 may be relatively small, such as less than about 200 nanometers, and may be substantially aligned normal to a surface of porous substrate 108. In some examples, the plurality of pores 110 may be very small, such as less than about 20 nanometers.

The electronic and/or thermal nanostructures of device 102 include a plurality of nanowires 114 dispersed in at least a portion of the plurality of pores 110. While the nanostructures described herein are referred to as nanowires, in other examples, nanorods or nanospheres may be used. The plurality of nanowires 114 may conduct electricity between the bottom surface of porous substrate 108 and top surface 112 of porous substrate 108 and/or generate and deliver heat to top surface 112 of porous substrate 108. As will be described further below, the plurality of pores 110 of porous substrate 108 may function as a template for forming the plurality of nanowires 114 within the plurality of pores 110, such that the plurality of nanowires 114 may have similar dimensions (e.g., diameters and, optionally, lengths) as the plurality of pores 110. As a result, the plurality of nanowires 114 have an average diameter less than about 20 nanometers. Despite the relatively low diameter, the plurality of nanowires 114 may have relatively low resistivity, such as nearly bulk resistivity of the material of the plurality of nanowires 114.

In some examples, device 102 is a connection device or layer configured to electrically connect and transmit electrical signals between surfaces of device 102. For example, the plurality of nanowires 114 may be interconnects configured to electrically connect a microchip or other electronic device to another electronic device. As will be described further below, the electronic and/or thermal nanostructures may include both the plurality of nanowires 114 and a plurality of solder nanodots formed on the plurality of nanowires 114 for reflowing and connecting to other devices.

In some examples, device 102 is a template device configured to form electronic nanodevices for removal from porous substrate 108 and use in other systems. As one example, such as will be described further in FIG. 4 below, device 102 may be configured to form the plurality of nanowires 114 as multilayer nanodevices in the plurality of pores 110 by sequential deposition of materials in the plurality of pores 110 to form the multilayer nanodevices, enabling measurement of material properties of the multilayer nanodevices. For example, the multilayer nanodevices may include magnetic ends for orienting the multilayer nanodevices on a measurement breadboard, or may include a form of a nanodevice (e.g., nanowire) that may be relatively simple to measure on the measurement breadboard.

In some examples, device 102 is a heating device configured to generate and distribute heat to one or more surfaces or materials. In such examples, system 100 may include a magnetic device 104 and a controller 106. Magnetic device 104 is configured to generate an alternating magnetic field have a corresponding magnitude and frequency. Controller 106 is configured to control magnetic device 104 to generate the alternating magnetic field. For example, controller 106 may be configured to receive input from an operator regarding one or more parameters of magnetic device 104 and send control signals to magnetic device 104 to produce an alternating magnetic field having the parameters. In such examples, device 102 may be configured to generate heat in response to the alternating magnetic field from magnetic device 104. The plurality of nanowires 114 include a magnetic material and are configured to generate heat in response to an alternating magnetic field. As will be described further in FIGS. 2A and 2B below, various thermal properties of the plurality of nanowires 114, such as magnetic anisotropy, may be configured for particular heating rates in response to the alternating magnetic field.

Heating devices described herein, such as device 102 of FIG. 1, may be used in a variety of applications. In some examples, heating devices may be used to transfer heat to tissues, such as cryopreserved tissues. For example, heating devices may heat relatively quickly (e.g., greater than about 50K/s), such that cryopreserved tissues may be reheated with reduced degradation of the tissue, and may enable a wider range of frequencies for heating. In some examples, heating devices may be used to transfer heat to other materials for use with nano- or micro-devices. For example, heating devices may enable directed reflow of solder for sequential device connections by subsequent localized heating. Current reflow practices may utilize global heating using non-optimal solders to vary eutectic temperatures for sequential device connections. In contrast, heating device using localized heating to reflow solder may use stronger, improved solders.

Figure 2A:
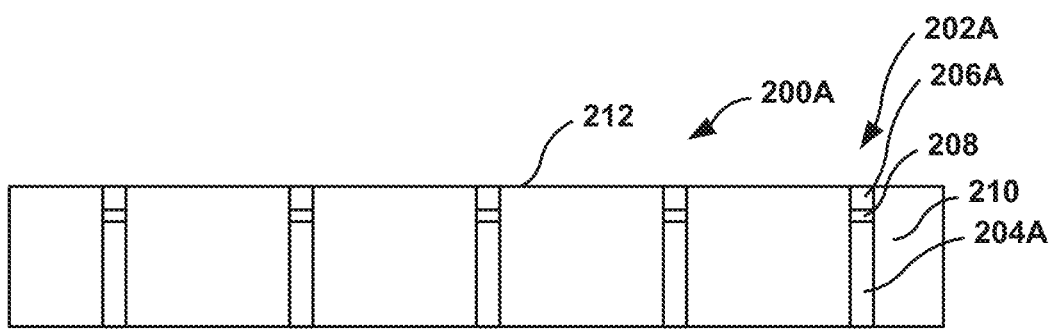
FIGS. 2A and 2B are schematic conceptual diagrams illustrating example devices according to techniques described herein.
Figure 2B:
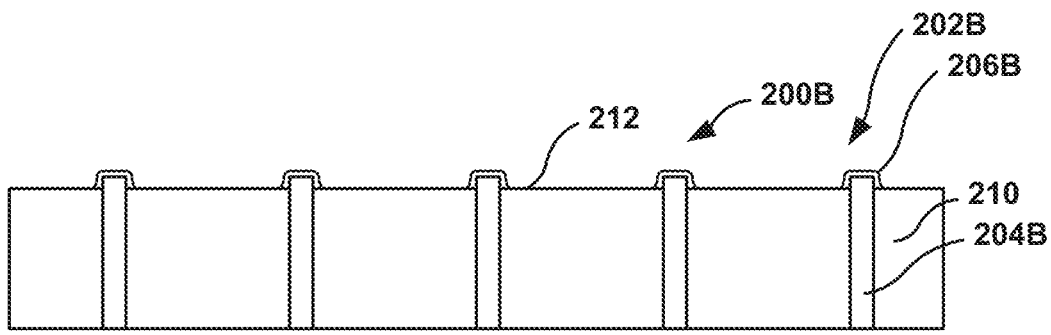

As described herein, a porous substrate, such as porous substrate 108 of FIG. 1, may be used to form nanodevices that include solder nanoparticles to form an electrical connection with another device or structure. FIGS. 2A and 2B are conceptual diagrams illustrating example devices 200A and 200B ("devices 200") that include a porous substrate 210 and a plurality of nanodevices 202A and 202B ("nanodevices 202") dispersed in the plurality of pores of porous substrate 210, such as described in device 102 of FIG. 1.

The plurality of nanodevices 202 include a plurality of nanowires 204A and 204B ("nanowires 204") configured to conduct electricity.

In some examples, nanodevices 202 are configured to both generate heat and use the heat to form an electrical connection with another device or structure. In such examples, the plurality of nanowires 204 are configured to generate heat in response to an alternating magnetic field. Without being limited to a particular theory, when magnetic nanowires 204 are placed in an alternating magnetic field (AMF) generated by a magnetic device, such as magnetic device 104, magnetic nanowires 204 convert electromagnetic energy from the AMF into heat, such as through Neel relaxation and, if magnetic nanowires 204 are in suspension, Brownian motion. The heat generated by magnetic nanowires 204 in the AMF increases with a frequency (f) and a field amplitude (H) of the AMF, such as may be controlled by a controller, such as controller 106 of FIG. 1. In an AMF, the energy per gram generated by magnetic nanowires 204 in each cycle can be written as Equation 1 below:

$$W_{heat} = \oint H \cdot dM \quad \text{(Equation 1)}$$

Figure 9A:
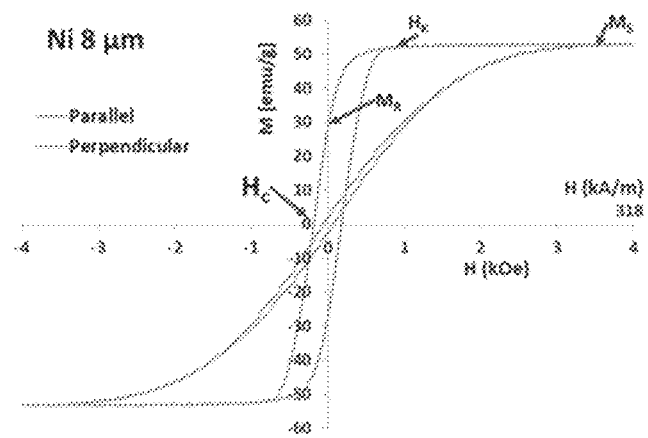
FIG. 9A is a graph of an example hysteresis loop for 8 micrometer nickel nanowires in an aluminum oxide membrane parallel and perpendicular to an applied magnetic field according to techniques described herein.

In Equation 1, $W_{heat}$ is equal to the area inside the hysteresis loop, H is the applied magnetic field, and M is the magnetization. As one example, FIG. 9A is a graph of the applied magnetic field vs the magnetization illustrating full hysteresis loops for gold (Au) tipped 8 micrometer (μm) nickel (Ni) nanowires oriented parallel or perpendicular to an applied magnetic field. The characteristic points are indicated, namely the saturation magnetization ($M_s$), the remnant magnetization ($M_R$) at 0 applied field, the coercive magnetic field ($H_c$) needed to demagnetize the sample, and the anisotropy field ($H_K$) which is the field required to fully align the magnetization in a given direction. For uniaxially anisotropic magnetic nanowires 204, the parallel hysteresis loop has an area that has been described as a parallelogram with height=$2(M_s)$ and width=$2(\mu_0 H_k)$, where to is the permeability of free space. Combining these with the anisotropy energy density (K) into Equation 2 below:

$$\mu_0 H_K = \frac{2K}{M_S}, \quad \text{(Equation 2)}$$

the maximum energy per gram may be represented as Equation 3 below:

$$W_{heat}^{max} = 4M_s \mu_0 H_k \quad \text{(Equation 3)}.$$

Equation 3 can be simplified as Equation 4 below:

$$W_{heat}^{max} = 8K \quad (4).$$

As illustrated in Equation 1-4 above, the magnetic anisotropy of the plurality of magnetic nanowires 204 has an important role in determining the heating properties of the magnetic nanowires 204. Properties of the plurality of magnetic nanowires 204 that may influence magnetic anisotropy may include crystallographic, shape, interfaces, and magnetoelasticity. As a result, various properties, such as a shape, size, and material composition, of the plurality of magnetic nanowires 204 may be configured to increase the heating efficiency of the plurality of magnetic nanowires 204.

In some examples, the plurality of magnetic nanowires 204 may be dimensioned for improved hysteresis loops to achieve increased heating for a particular magnetic field amplitude and frequency. For example, magnetic nanowires 204 may be configured with a relatively high length-to-diameter aspect ratio, such that the shape anisotropy dominates the magnetic performance. The plurality of magnetic nanowires 204 may have an average diameter between about 10 nanometers and about 200 nanometers. The plurality of magnetic nanowires 204 may have an average length between about 1 micrometer and about 100 micrometers.

Figure 9B:
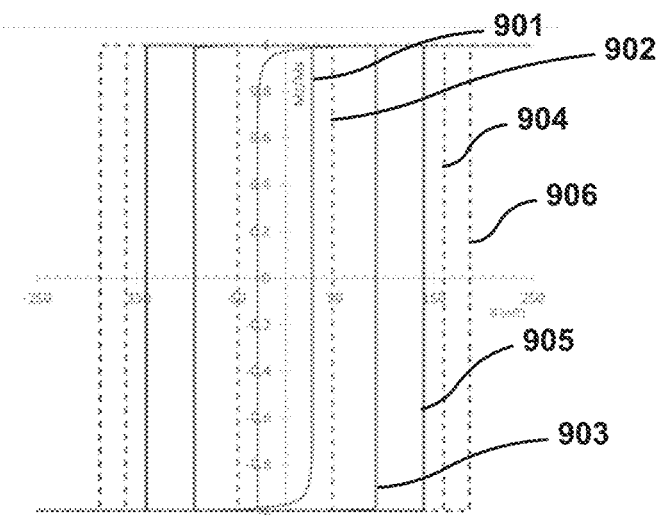
FIG. 9B is a graph of example hysteresis loops for nickel nanowires having different diameters and different cross-section shapes.

In addition, the shape of tips of the magnetic nanowires 204 may be configured to enhance or reduce the coercivity, as the shape of the tips of the magnetic nanowires may control a magnetization reversal mechanism. A coercivity of the plurality of magnetic nanowires 204 may be configured to be less than the magnetic field amplitude to ensure switching of the plurality of magnetic nanowires 204 every cycle. For example, while a large saturation moment may increase a height of the hysteresis loop (e.g., see $M_S$ in FIG. 9A), an amplitude of the applied magnetic field may be limited, especially when switching at higher frequencies. Alternatively, the plurality of magnetic nanowires 204 may be configured to deliver heat differently from particular magnetic nanowires 204, such that different magnetic nanowires 204 may be heated at different rates. For example, sequential reflow steps can be controlled by controller 106 by applying the magnetic field to induce different degrees of heating and/or expansion. FIG. 9B is a graph of an example hysteresis loop for 8 micrometer nickel nanowires in an aluminum oxide membrane parallel and perpendicular to an applied magnetic field, and illustrates preliminary results for simulations of six different types of nickel magnetic nanowires, in which coercivity was engineered to match various AMF amplitudes.

Figure 9C:
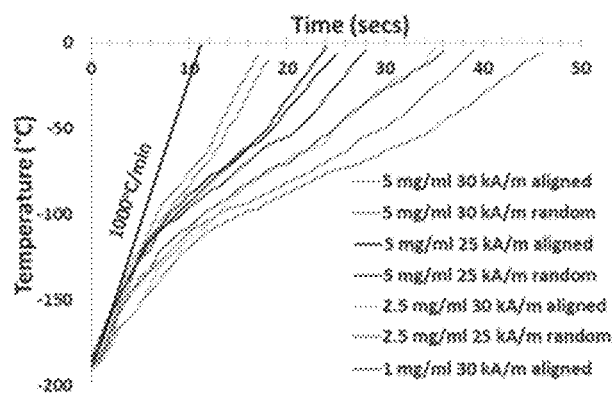
FIG. 9C is a graph of example heating curves for 8 micrometer $Co_{35}Fe_{65}$ nanowires at various densities, alignments, and magnetic fields according to techniques described herein.

In some examples, the plurality of magnetic nanowires 204 may be configured with a composition having a relatively high specific absorption rate. The specific absorption rate (SAR) may represent a rate of heating in response to a particular applied magnetic field, and may be calculated from a plot of temperature versus time during heating of a solution or tissue of interest. FIG. 9C is a graph of example heating curves for 8 micrometer $Co_{35}Fe_{65}$ nanowires at various densities, alignments, and magnetic fields. In some examples, the SAR may be between about 500 W/g and about 2000 W/g. Compositions that may be used for the plurality of magnetic nanowires may include, but are not limited to, nickel (Ni), cobalt (Co), iron (Fe), iron (III) oxide ($Fe_3O_4$), cobalt ferrite ($Co_{35}Fe_{65}$), and the like. In some examples, the plurality of magnetic nanowires may be coated. For example, the plurality of magnetic nanowires 204 may be coated with PEG or other biological molecules to improve biocompatibility, buoyancy, and dispersibility in biomedical applications. In some examples, the magnetic nanowires 204 may be coated with HS-PEG-COOH, such as on gold surfaces, or dopamide-PEG, such as on $Co_{35}Fe_{65}$, Fe, Co, or Ni surfaces.

In some examples, the plurality of magnetic nanowires 204 may include metals having a relatively high thermal conductivity. For example, a thermal conductivity of may be between about 80 W/m/K and about 350 W/m/K. In contrast, a thermal conductivity of porous substrate 108 may be less than the thermal conductivity of the plurality of magnetic nanowires 204. For example, the thermal conductivity of porous substrate 108 may be less than about 50 W/m/K. As a result of this difference in thermal conductivity, the plurality of nanowires 114 may function as heat fins to transfer heat through heating device 100 to surface 112 of heating device 100.

In some examples, the plurality of nanodevices 202 may be configured for efficient heating of the tips of the plurality of magnetic nanowires 204. For example, the plurality of magnetic nanowires 204 may be configured with a balance between heating elements and conduction. Referring to FIG. 2A, in some examples, the plurality of nanodevices 202A may include a conductive tip 208 on one or more of the plurality of magnetic nanowires 204A. Conductive tip 208 may be configured to distribute heat generated by magnetic nanowire 204A to a respective solder nanoparticle 206A. For example, conductive tip 208 may include a material having a relatively high thermal conductivity, such as copper or gold, to increase a transfer of heat from magnetic nanowire 204A to solder nanoparticle 206A. As a result, magnetic metals of magnetic nanowires 204A with lower conductivity may be segmented with higher thermal conductivity metals of conductive tip 208, such as copper, for the highest thermal conductivity directed to a surface of conductive tip 208.

Porous substrate 210 defines a top major surface 212. Porous substrate 210 may be configured to function as a support for the plurality of nanowires 204. Porous substrate 210 may be fabricated from a variety of materials including, but not limited to, oxides, such as aluminum oxide, silicon, and other materials that may form relatively defined pores. In some examples, porous substrate 210 may include pores that may be configured (e.g., formed or selected) within a relatively small size and/or orientation range. For example, aluminum oxide may include relatively tightly controlled pores 110, such that the resulting nanowires 204 formed in situ may have relatively uniform diameters. In some examples, the plurality of pores 110 may have an average diameter between about 5 nanometers and about 15 nanometers, with a standard deviation within about 3 nanometers.

In some examples, porous substrate 210 may include an oxide layer on a platform substrate. For example, the platform substrate may be configured as a heat sink, while the oxide layer may be configured as a template for magnetic nanowires 204. Some of the oxide templates may be silicon-integrated (e.g., an aluminum film may be deposited onto silicon and anodized to create the oxide template) such that silicon may operate as a potential heat sink.

While porous substrate 210 has been described as including pores, in some examples, porous substrate 210 may include coplanar waveguides (CPWs) to deliver extremely localized heating. For example, the plurality of nanowires 204 may be grown into spaces, such as the top and/or inside the gaps of CPWs, to differentiate rows or groups of nanowires 204, such that local alternating current magnetic fields may be applied only to small rows of magnetic nanowires, rather than in arrays.

In some examples, in addition to the plurality of nanowires 204, the plurality of nanodevices 202 may include a plurality of solder nanoparticles 206 dispersed on the plurality of nanowires 204, such as directly or indirectly through conductive tip 208. Solder nanoparticles 206 may be configured to flow in response to a heating stimulus and provide electrical and/or thermal contact between the plurality of nanowires 204 and another device or material, such to a microchip or tissue. In example in which the plurality of nanowires 204 are magnetic nanowires, the magnetic nanowires 204 are configured to generate heat in response to an alternating magnetic field and transfer at least a portion of the heat to the array of solder nanoparticles 206. Solder nanoparticles 206 may include at least one of tin (Sn), copper (Cu), silver (Ag), silicon (Si), indium (In), zinc (Zn), or antimony (Sb).

In some examples, electronic nanodevice 200 may be configured to selectively reflow particular solder nanoparticles 206 or groups of solder nanoparticles 206. For example, magnetic nanowires 204 may be configured, such as through difference sizes or different compositions, to heat to particular temperatures at different times by controlling the heating rate of the particular magnetic nanowires 204. A particular magnetic nanowire 204 may only generate a substantial amount of heat in response to a magnetic field once a threshold magnetic field amplitude has been reached, exhibiting digital heating between an "on" state and an "off" state as the particular nanowire 204 is switched and other nanowires 204 are not switched. This threshold magnetic field amplitude may be related to a diameter of magnetic nanowire 204 or properties related to a composition of magnetic nanowire 204, such as magnetic anisotropy, exchange, and/or saturation magnetization. For example, the threshold magnetic field amplitude may be substantially linearly related to the exchange/magnetization and exponentially related to the diameter.

Figure 11:
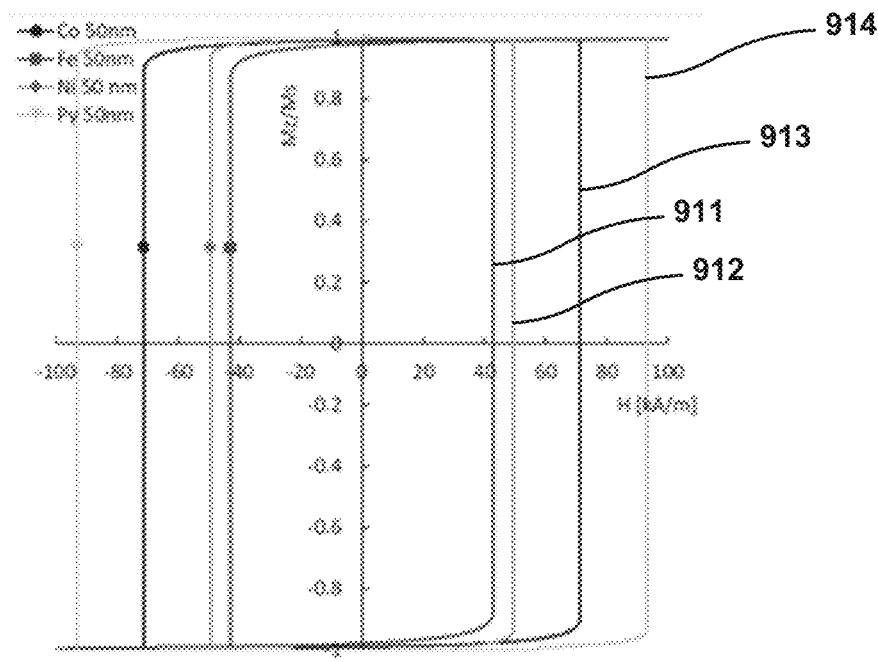
FIG. 11 is a graph of example hysteresis loops for 50 nanometer cobalt, iron, nickel, and permalloy nanowires according to techniques described herein.

In some examples, nanowires 204 may have different compositions. FIG. 11 is a graph of example hysteresis loops for 50 nanometer cobalt, iron, nickel, and permalloy nanowires according to techniques described herein. As illustrated in FIG. 11, different compositions may result in differently-shaped hysteresis loops, including different switching threshold magnetic field amplitudes. FIG. 11 illustrates a hysteresis loop 911 for iron nanowires, a hysteresis loop 912 for nickel nanowires, a hysteresis loop 913 for cobalt nanowires, and a hysteresis loop 914 for permalloy nanowires. In the example of FIG. 11, the magnetic nanowires with diameter of 50 nm all had coercivities within the fields that may be easily achieved by medical AMFs, and had the largest area loops within this constraint, with coercivities ranging from 42 to 93 kA/m. The coercivity may scale with a factor of A/Ms, which agrees with the mechanism of vortex formation. In this way, it may also be possible to tailor magnetic nanowires to accommodate application-specific magnetic field strengths for optimal heating.

In some examples, nanowires 204 may have different diameters and/or shapes. FIG. 9B is a graph of example hysteresis loops for nickel nanowires having different diameters and different cross-section shapes. FIG. 9B illustrates a hysteresis loop 901 for 100 nanometer cylindrical nanowires, a hysteresis loop 902 for 100 nanometer elliptical nanowires, a hysteresis loop 903 for 50 nanometer cylindrical nanowires, a hysteresis loop 904 for 50 nanometer elliptical nanowires, a hysteresis loop 905 for 30 nanometer cylindrical nanowires, and a hysteresis loop 906 for 30 nanometer elliptical nanowires. As illustrated in FIG. 9B, as a diameter of the nanowires increase, a threshold magnetic field amplitude increases, and as a cross-sectional shape of the nanowires is less rounded, a threshold magnetic field amplitude increases.

To create multiple different states, electronic nanodevice 200 may include nanowires 204 having different compositions and diameters that are characterized by different threshold magnetic field amplitudes. As a result, different solder nanoparticles 206 may be reflowed at different times, permitting sequential connections with a same applied alternating magnetic field. In some examples, rather than or in addition to configuring magnetic nanowires for sequential connections, particular solder nanoparticles 206 and/or groups of solder nanoparticles 206 may be configured, such as through different volumes or different compositions, to reflow at different times by controlling the heating rate of the particular solder nanoparticles 206.

Figure 10:
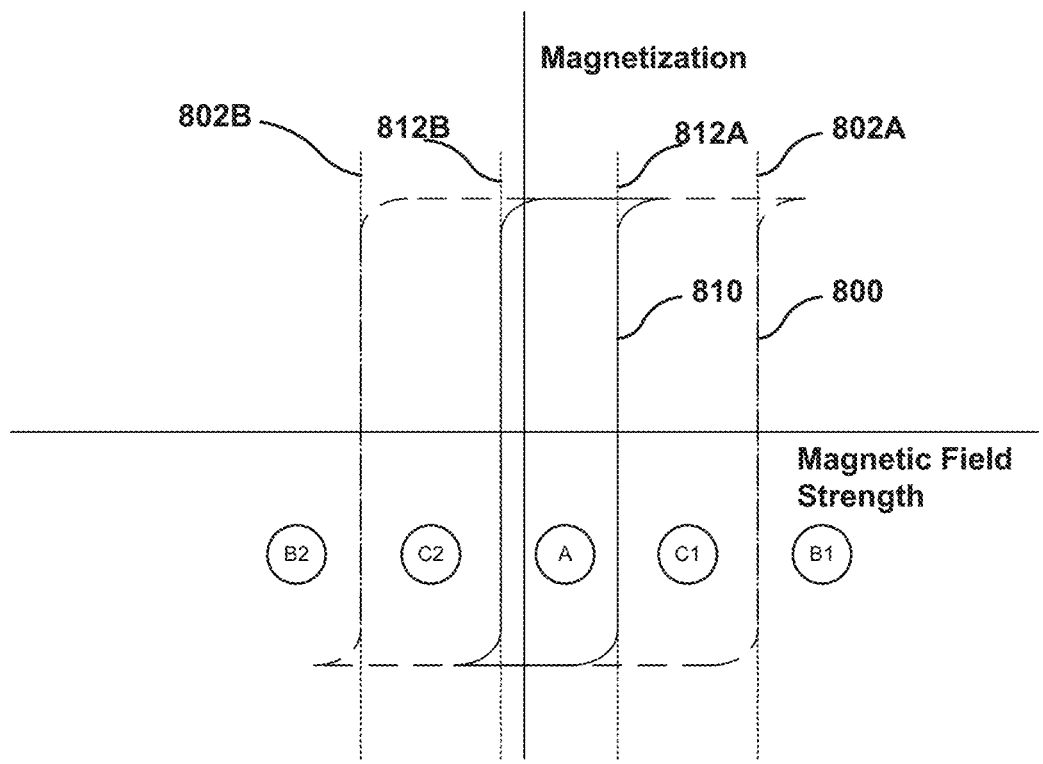
FIG. 10 is an example graph of hysteresis loops of two different nanowires according to techniques described herein.

FIG. 10 is an example graph of hysteresis loops of two different nanowires. A first nanowire has a first hysteresis loop 800 characterized by a switching field bounded by a first positive threshold magnetic field amplitude 802A and a first negative threshold magnetic field amplitude 802B (collectively, "first threshold magnetic field amplitude 802"). The second nanowire has a second hysteresis loop 810 that is characterized by a switching field bounded by second positive threshold magnetic field amplitude 812A and a second negative threshold magnetic field amplitude 812B (collectively, "second threshold magnetic field amplitude 812"). The first threshold magnetic field amplitude 802 of the first nanowire is higher than the second threshold magnetic field amplitude 812 of the second nanowire, such that first hysteresis loop 800 overlaps second hysteresis loop 810. For example, the first nanowire may have a smaller diameter than the second nanowire, or may be fabricated from a material having different magnetic properties, such as values of an exchange parameter, crystalline anisotropy, or saturation magnetization, than the second nanowire.

When no magnetic field is applied to the nanowires (A), neither the first nor the second nanowires may generate heat. When a high amplitude magnetic field is applied to the nanowires (alternating between B1 and B2), the magnetic field amplitude exceeds both the first and second threshold magnetic field amplitudes 802 and 812, generating heat in both the first and second nanowires and, correspondingly, reflowing solder nanoparticles coupled to both the first and second nanowires. When a low amplitude magnetic field is applied to the nanowires (alternating between C1 and C2), the magnetic field amplitude exceeds the second threshold magnetic field amplitude 812, but not first threshold magnetic field amplitude 802, generating heat in only the second nanowire. This difference in heating may be used to connect the first nanowire to a first device at a first time, and to connect the second nanowire to a second device at a second time. For example, the high amplitude magnetic field (B1, B2) may be used to heat the first nanowire, along with the second nanowire, to connect a first device to the first nanowire at a first time. Subsequently the low amplitude magnetic field (C1, C2) may be used to heat the second nanowire, without heating the first nanowire, to connect a second device to the second nanowire.

In this way, nanodevice 200 may enable selective connection of devices that is independent of an order of operations based on geometry or solder composition. For example, in some fabrication methods of a stacked microchip, devices within the microchip may be assembled in layers, with solder particles between the different layers of devices having increasingly lower melting points to permit attachment of one layer of devices without melting subsequent layers. The melting point of the solder particles may be further limited by a threshold temperature at which the devices degrade.

However, in one or more examples described in this disclosure, devices may be connected to nanodevice 200 without layer-by-layer assembly. For example, various nanowires having relatively low threshold magnetic field amplitudes may be reserved for attachment of future devices after microchip fabrication is complete. Nanodevice 200 may also enable the use of solder nanoparticles having higher melting points, including melting points that exceed a thermal degradation temperature of the devices, as the heat may be limited to a localized area near the respective solder nanoparticle.

In operation, electronic device 200 may be operated to reflow the array of solder nanoparticles 206. An alternating magnetic field may be applied to electronic nanodevice 200. The plurality of magnetic nanowires 204 generate heat in response to the alternating magnetic field and transfer at least a portion of the heat to the array of solder nanoparticles 206.

In the example of FIG. 2A, the plurality of solder nanoparticles 206A are present on a surface of nanowires 204A within the pores of porous substrate 210. For example, nanowires 204A may be formed beneath a surface of porous substrate 210, such that nanowires 204A do not extend past a plane of major surface 212 of porous substrate 210. Solder material may preferentially fill the pores on the top of nanowires 204A due to a relatively low surface energy of nanowires 204A, such that solder nanoparticles 206A are positioned within the pores of the porous substrate. As a result, solder nanoparticles 206A may have a relatively small size, such as a diameter of the pores. For example, solder nanoparticles 206A have an average diameter between about 10 nanometers and about 200 nanometers, such as less than about 20 nanometers. Such small size may enable solder nanoparticles 206A having a relatively high density. For example, the plurality of solder nanoparticles may be used as solder ball grid arrays for connecting electronic components.

In the example of FIG. 2B, the plurality of solder nanoparticles 206B are present on a surface of nanowires 204B outside of the pores of porous substrate 210. For example, a portion of nanowires 204B may be formed above major surface 212 of porous substrate 210, such that nanowires 204B extend to (not shown) or past (shown in FIG. 2B) a plane of major surface 212 of porous substrate 210. Solder material may preferentially contact at least a portion of a corresponding nanowire 204B, such as a top surface or lateral surface, due to a relatively low surface energy of nanowires 204B compared to porous substrate 210, such that solder nanoparticles 206B are positioned on or around nanowires 204B. As a result, solder nanoparticles 206B may have a relatively small size, such as less than about ten times a diameter of the pores. For example, solder nanoparticles 206B have an average diameter between about 10 nanometers and about 200 nanometers, such as less than about 100 nanometers.

Figure 3A:
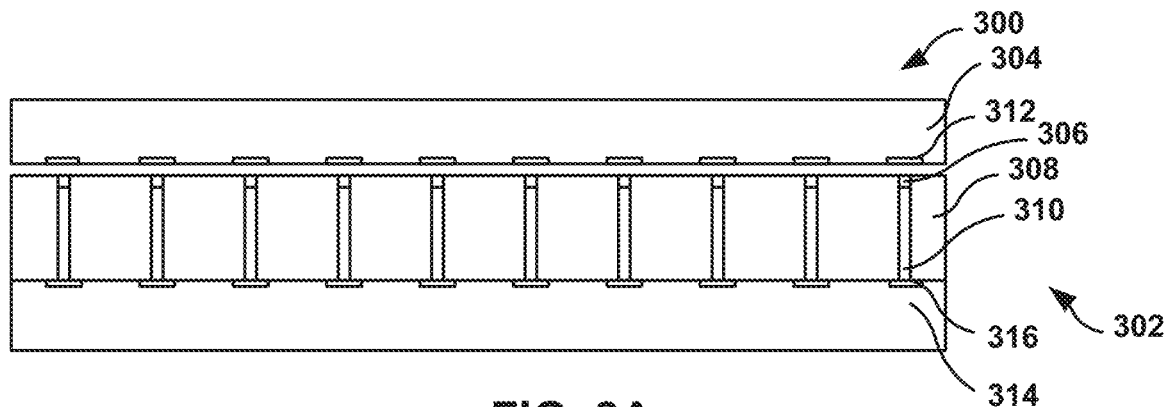
FIGS. 3A-3C are schematic conceptual diagrams illustrating example electronic systems according to techniques described herein.
Figure 3B:
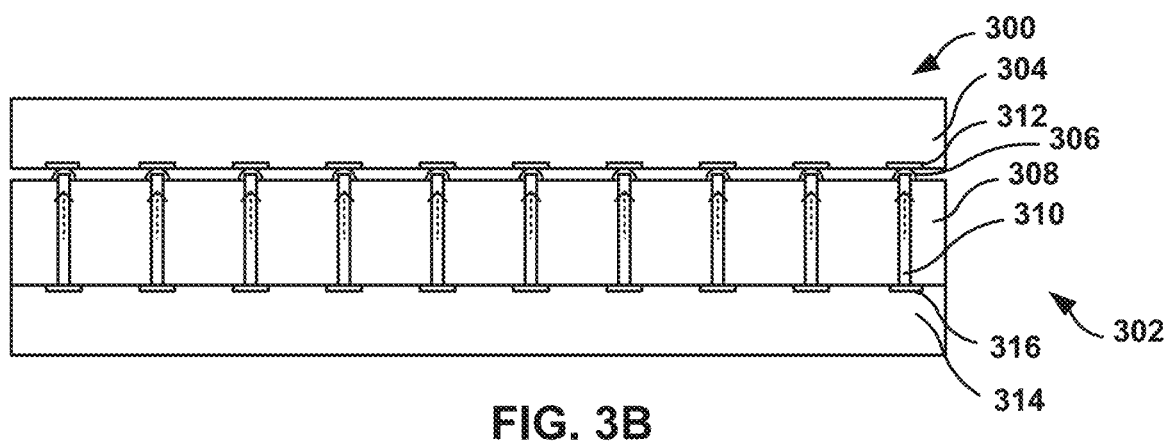

In some examples, heating devices described herein may be used for connecting devices by reflowing solder materials. FIGS. 3A and 3B are schematic conceptual diagrams illustrating an example electronic system 300 according to techniques described herein. Referring to FIG. 3A, electronic system 300 includes a first electronic device 302 and a second electronic device 304. Each of first electronic device 302 and second electronic device 304 may include any electronic device, such as a circuit board, microchip, or the like. Second electronic device 304 includes one or more contact pads 312. Each contact pad 312 is configured to contact an electrical conductor to receive and/or send electrical signals from or to the electrical conductor.

First electronic device 302 is configured to electrical couple to second electronic device 304. First electronic device 302 includes a porous substrate 308 on a conductive substrate 314. Conductive substrate 314 include a plurality of patterned electrodes 316 configured to transmit electrical signals. Porous substrate 308 includes a plurality of pores aligned substantially normal to a surface of porous substrate 308 and over the plurality of patterned electrodes 316. First electronic device 302 also includes a plurality of magnetic nanowires 310 dispersed in the plurality of pores and a plurality of solder nanoparticles 306 on the plurality of magnetic nanowires 310, such as described in FIG. 2. The plurality of magnetic nanowires 310 are electrically coupled to the plurality of patterned electrodes 316.

Referring to FIG. 3B, the plurality of magnetic nanowires 310 are configured to generate heat in response to an alternating magnetic field and deliver at least a portion of the heat to the plurality of solder nanoparticles 306. The heated solder nanoparticles 306 may reflow to contact at least a portion of the one or more contact pads 312 and electrically couple first electronic device 302 to second electronic device 304. In some examples, the plurality of magnetic nanowires 310 are configured to expand to increase a contact surface of the plurality of magnetic nanowires 310 and the plurality of solder nanoparticles 306 and/or extend solder from the plurality of solder nanoparticles 306 toward contact pads 312. For example, the plurality of magnetic nanowires 310 may have a coefficient of thermal expansion greater than about 5 parts per million (ppm) per degree Kelvin (K).

In operation, first electronic device 302 may be operated to electrically couple the electronic system 300. An alternating magnetic field may be applied to first electronic device 302. The plurality of magnetic nanowires 310 generate heat in response to the alternating magnetic field and transfer at least a portion of the heat to the plurality of solder nanoparticles 306. The plurality of solder nanoparticles 306 may reflow and contact at least a portion of one or more contact pads 312 of second electronic device 304 to electrically couple first electronic device 302 to second electronic device 304.

Figure 3C:
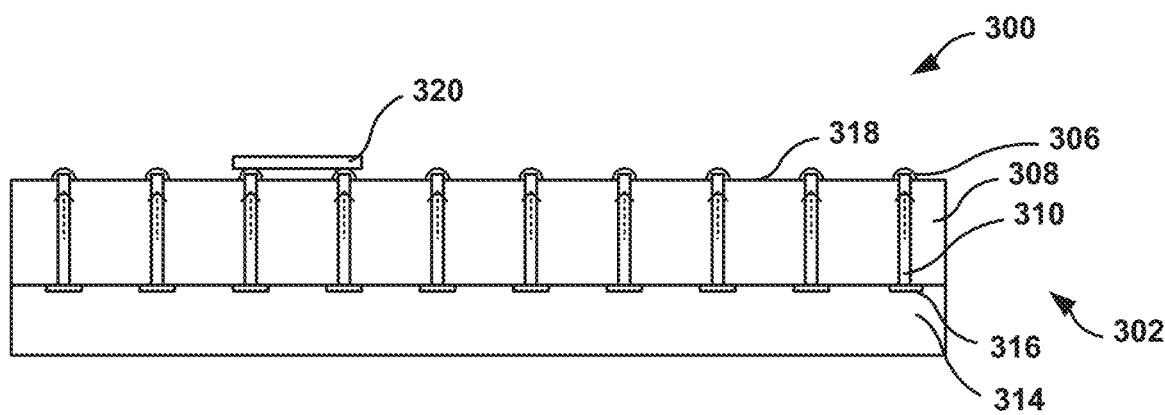

In some examples, rather than an electronic device that includes contact pads, devices described herein may be configured to electrically couple to dispersed nanodevices to incorporate the dispersed nanodevices into the electronic system. FIG. 3C is an example electronic system 300 that includes one or more connective nanodevices 320 dispersed across a major surface 318 of porous substrate 308. Connective nanodevices 320 are each configured to electrically couple to solder nanoparticles 306 of two or more nanodevices in porous substrate 308. Connective nanodevices 320 may function as electronic components coupled to electronic device 302 via nanowires 310. As will be described below in FIGS. 4A and 4B, connective nanodevices 320 may include various features that enable or promote arrangement on a surface of porous substrate 308, such that connective nanodevices 320 may be arranged to form particular circuits or other electronic functional structures.

In some examples, heating devices described herein may be used for characterizing other devices, such as nanodevices, by forming particular nanodevices and/or manipulating and measuring various properties of the nanodevices. For example, nanodevices may be relatively difficult to isolate and characterize due to their small size and tendency to agglomerate. While electrodes may be patterned onto such devices using e-beam after the devices are collected onto an insulting substrate. The e-beam patterning of contacts to measure each device is very time consuming, and trying to orient nanodevices onto pre-patterned contacts typically does not enable a robust electrical connection between the device and contacts. Other processes may use gold-coated atomic force microscopy (AFM) tips to make contact lightly with single nanowires in arrays. Slightly too much pressure on the tip will cause multiple devices to be measured at the same time. This causes much speculation in the determination of resistivity of nanodevices.

Heating devices described herein may be configured to apply heat to particular nanodevices and measure electrical properties of the nanodevices. FIG. 4 is a schematic conceptual diagram illustrating an example nanodevice characterization system 400 according to techniques described herein. Nanodevice characterization system 400 includes a template device 418 configured to generate particular nanodevices, a probing device 402 configured to position nanodevices, and a measurement device 420 configured to measure various properties of nanodevices.

Template device 418 may be configured to generate target nanodevices 410 for measurement using nanodevice characterization system 400. For example, while nanodevice characterization system 400 may be configured to characterize a variety of different nanodevices, nanodevices 410 generated by template device 418 may have relatively consistent size and dimensions, and may include one or more layers that aid in positioning or orienting nanodevice 410 for characterizing the material of nanodevice 410. Template device 418 may be configured to form nanodevice 410 by sequentially depositing various materials in the pores of a porous substrate 404. For example, porous substrate 404 may have pores having a particular known or desired size (e.g., diameter and/or length). In some examples, nanodevice 410 may include one or more magnetic portions 412. For example, a magnetic material may be deposited in pores of porous substrate 404, followed by deposition of a particular material for characterization followed by the magnetic material to form nanodevice 410 including magnetic portions 412.

Nanodevice characterization system 400 includes probing device 402 and measurement device 414 communicatively coupled to probing device 402. Probing device 402 includes a porous substrate 404 that includes a plurality of pores and defines a surface 416 of probing device 402. Probing device 402 includes a plurality of probing nanodevices that includes a plurality of magnetic nanowires 406 dispersed in the plurality of pores and extending from a bottom of probing device 402 to surface 416 of probing device 402. Measurement device 420 is electrically coupled to the plurality of magnetic nanowires 406, such as at the bottom of probing device 402. In some examples, measurement device 420 may include an oscilloscope configured to measure resistance.

Surface 416 of probing device 402 is configured to receive one or more nanodevices 410. Nanodevices 410 may include any materials or structures having at least one dimension less than about 10 nanometers. Nanodevices 410 may have various properties, such as thermal or electrical properties, that may be unknown or unquantified. Nanodevice characterization system 400 may be configured to measure various properties of nanodevices 410.

Figure 4A:
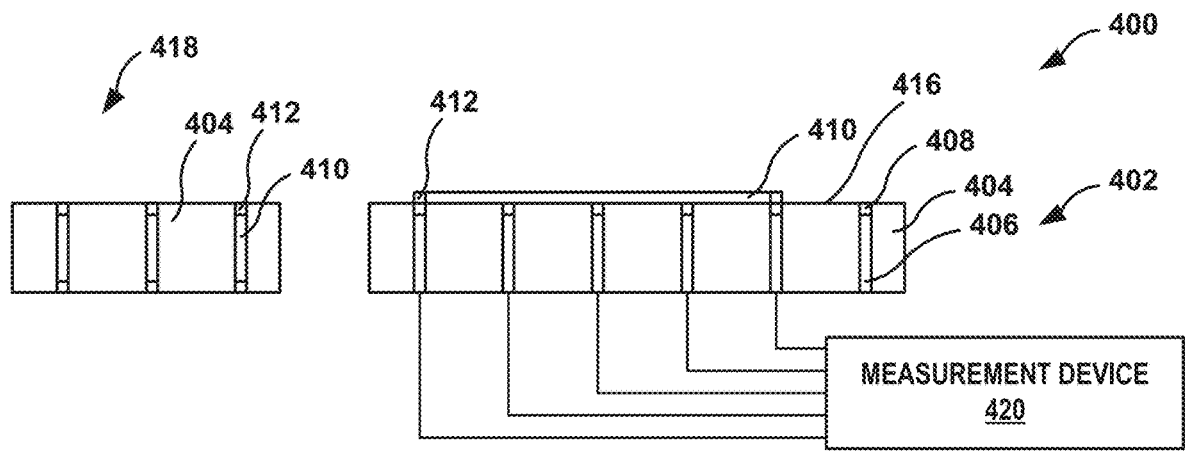
FIG. 4A is a schematic conceptual diagram illustrating an example nanodevice characterization system according to techniques described herein.

To aid in positioning and electrically connecting nanodevices 410 to the plurality of magnetic nanowires 406, probing device 402 may include a plurality of solder nanoparticles 408 on the plurality of magnetic nanowires 406 to form nano-pins. The plurality of magnetic nanowires 406 are configured to generate heat in response to an alternating magnetic field and transfer the heat to the plurality of solder nanoparticles 408. Solder nanoparticles 408 may be configured to reflow and make electrical contact with one or more portions of nanodevice 410. For example, as illustrated in FIG. 4A, multiple nanowires 406 may be electrically coupled to nanodevice 410 through solder nanoparticles 412 at various locations.

In some examples, probing device 402 may be configured to position nanodevices 410 on surface 416. For example, nanodevice 410 may include at least one magnetic portion 412 that is temporarily or permanently magnetized. Magnetic portion 412 may be grown onto nanodevice 410 to enable orientation of nanodevice 410 perpendicular to particular magnetic nanowires and/or rows of magnetic nanowires. Magnetic portion 412 may be attracted to magnetic nanowires 406, such that the magnetic portion 412 may "click" or otherwise magnetically coupled to one or more magnetic nanowires 406 to align nanodevice 410 on probing device 402 and thermally and electrically couple nanodevice 410 to magnetic nanowires 406.

Figure 4B:
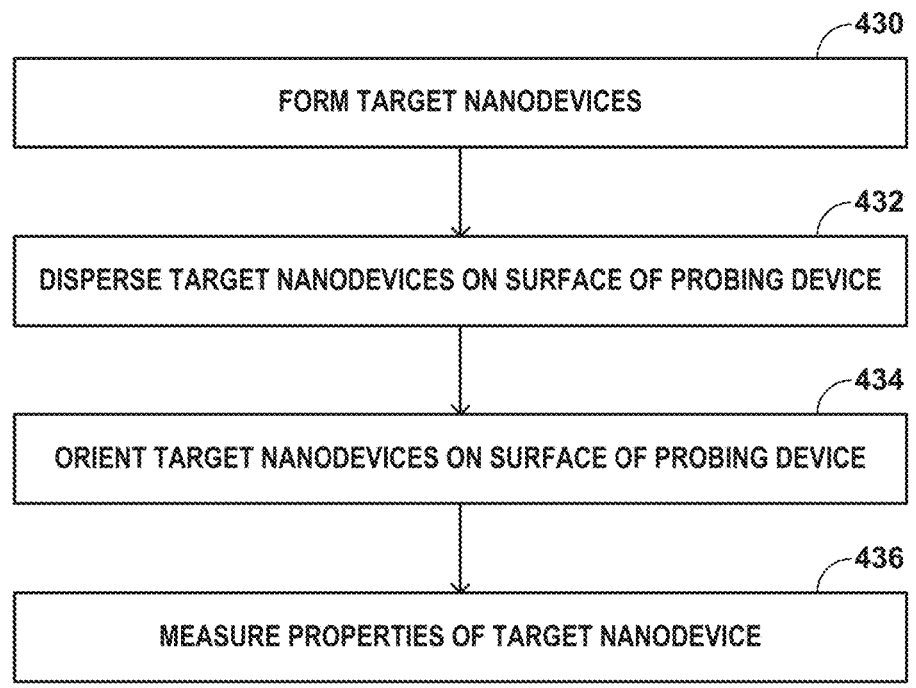
FIG. 4B is a flowchart illustrating example characterization of a nanodevice according to techniques described herein.

In operation, nanodevice characterization system 400 may be operated to measure one or more properties of one or more nanodevice 410. FIG. 4B is a flowchart illustrating example characterization of a nanodevice according to techniques described herein. The method of FIG. 4B includes forming nanodevice 410 (430). In some examples, nanodevice 410 may be a nanodevice from template device 418. For example, metallic nanowires may be grown in porous substrate 404 and released into a solution. The method of FIG. 4B includes dispersing nanodevices 410 on a surface of probing device 402 (432). The solution that includes target nanodevices 410 may be dropped and dispersed on surface 416 of probing device 402. The method of FIG. 4B includes orienting target nanodevice 410 on surface 416 of probing device 402. For example, a small direct current magnetic field may be applied to orient suspended target nanodevices 410. Once the suspension fluid has evaporated, friction and/or magnetic portion 412 may hold nanodevices 410 onto probing device 402. An alternating magnetic field may be applied to probing device 402 to generate heat from the plurality of nanowires 406 and reflow the plurality of solder nanoparticles thereby electrically connecting target nanodevice 410 to the plurality of nanowires 406. The method of FIG. 4B includes measuring properties of target nanodevice 410. For example, measurement device 414 may measure one or more properties of one or more nanodevices 410, such as resistivity, ferromagnetic properties, and the like.

Figure 5:
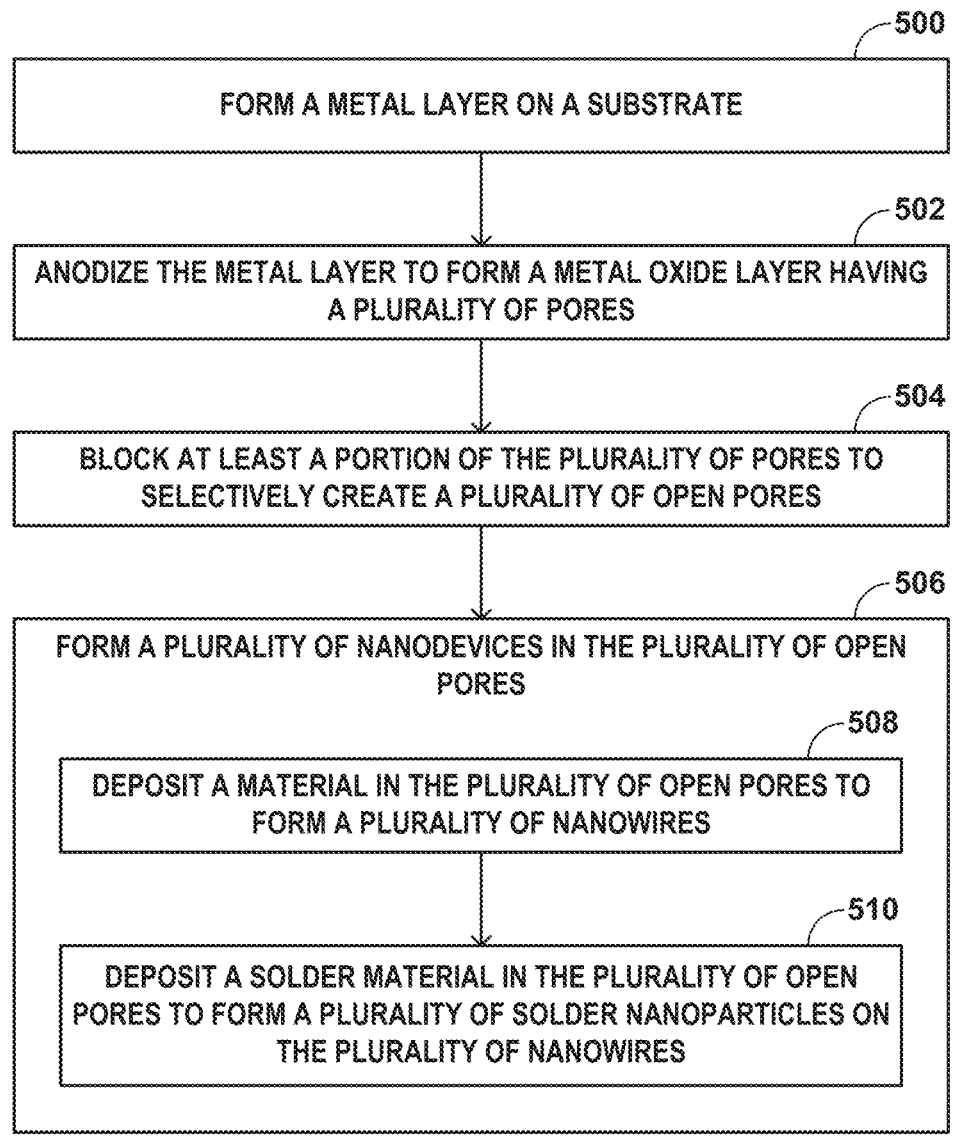
FIG. 5 is a flowchart illustrating example formation of a device according to techniques described herein.

Devices described herein may be fabricated by forming magnetic nanowires in situ in a porous substrate. Such in situ formation may be relatively easy to fabricate with relatively small and tight size dimensions for magnetic nanowires. FIG. 5 is a flowchart illustrating example formation of a device according to techniques described herein.

The method of FIG. 5 includes forming a porous substrate by forming a metal layer on a substrate (500). For example, the metal layer may include aluminum metal stamped onto a silicon substrate, patterned electrode, or other substrate used as a base for an electronic device. The method of FIG. 5 includes anodizing the metal layer to form a metal oxide having a plurality of pores in the oxide layer (502). For example, the aluminum layer or film may be anodized to form aluminum oxide. Aluminum oxide may form relatively uniformly sized and spaced pores. The method of FIG. 5 includes blocking a portion of the plurality of pores to selectively create a plurality of open pores (504). The plurality of open pores may form a pattern that corresponding to the resulting nanodevices formed in the plurality of open pores. To block the portion of the plurality of pores, a photo-resist pattern may be applied to the portion of the plurality of pores. The resulting plurality of open pores may have a size sufficiently small that nanowires formed in the plurality of pores have a relatively high magnetic anisotropy and a pattern that corresponds to a desired location of the nanowires. For example, the plurality of pores may have an average diameter less than about 20 nanometers.

The method of FIG. 5 includes forming a plurality of nanodevices in the plurality of open pores (506). In some examples, forming the plurality of nanodevices includes depositing a conductive and/or magnetic material in the plurality of open pores to form a plurality of nanowires (508). For example, the conductive and/or magnetic material may be grown from the underlying substrate at the bottom of the porous substrate to a particular depth of the plurality of pores corresponding to a desired length of the plurality of nanowires. In some examples, depositing the conductive and/or magnetic material further includes electrodepositing the conductive and/or magnetic material. For example, various conditions of the electrodeposition, such as a concentration of precursors in the electrodeposition solution, may be controlled to form the plurality of nanowires having particular properties. In some examples, additional metals, such as conductive metals, may be deposited on the plurality of nanowires, such as to aid in heat transfer from a magnetic nanowire to an overlying surface.

In some examples, forming the plurality of nanodevices further includes depositing a solder material in the plurality of open pores to form a plurality of solder nanoparticles on the plurality of nanowires (510). For example, as illustrated in FIG. 2A, the nanowires may be grown such that they do not extend past a plane of a major surface of the porous substrate. The solder material may be deposited in the plurality of pores on the surface of the plurality of nanowires to form the solder nanoparticles. The solder material may be grown from a surface of the underlying nanowire to a top of the corresponding pore to form a solder nanoparticle. In some examples, depositing the solder material further includes electrodepositing the solder material on the magnetic nanowires. The resulting solder nanoparticles may have a relatively small size that corresponds to the pore size of the porous substrate, such as an average diameter less than about 20 nanometers.

In some examples, forming the plurality of nanodevices further includes depositing a solder material on a major surface of the porous substrate to form a plurality of solder nanoparticles on or around the plurality of nanowires. For example, as illustrated in FIG. 2B, the nanowires may be grown such that they extend up to or past a plane of a major surface of the porous substrate. The solder material may be deposited on the major surface of the porous substrate and a portion of the solder material may be removed from the major surface to form the solder nanoparticles. For example, the solder material may have a stronger affinity to the nanowires due to the relatively low surface tension of the nanowires compared to the porous substrate. As a result, removing the portion of the solder material from the major surface to may leave a portion of the solder material contacting at least a portion of the corresponding nanowire extending up to or past the plane of the major surface. The resulting solder nanoparticles may have a relatively small size that corresponds to an order of magnitude of the nanowire size, such as an average diameter less than about 100 nanometers.

In some examples, the method of FIG. 5 may include additional steps, such as coupling other devices or structures to the device. For example, such as illustrated in FIG. 3C, the method may include dispersing one or more connective nanodevices across a major surface of the porous substrate and electrically coupling each of the one or more connective nanodevices to the solder nanoparticles of two or more nanodevices of the plurality of nanodevices in the porous substrate.

Figure 6A:
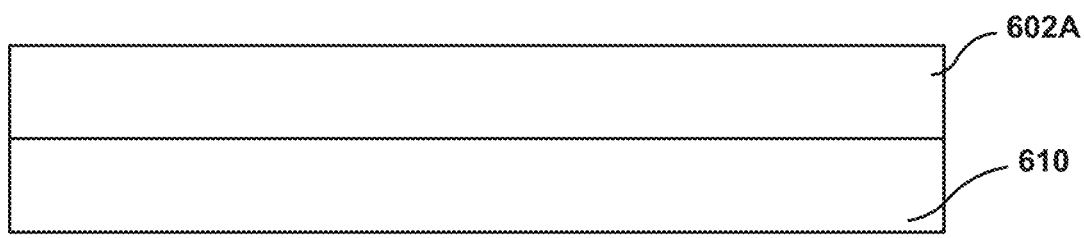
FIGS. 6A-6D are schematic conceptual diagrams illustrating example formation of a heating device according to techniques described herein.
Figure 6B:
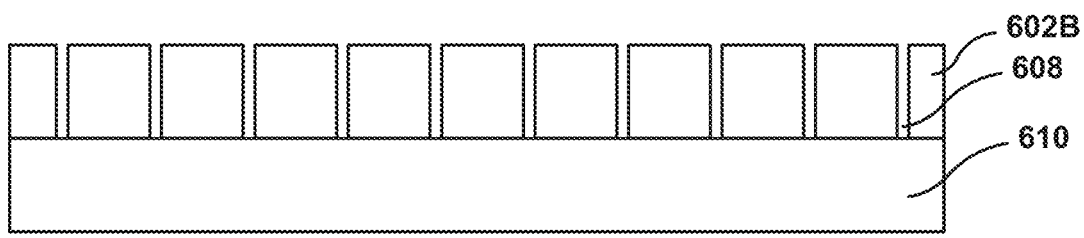
Figure 6C:
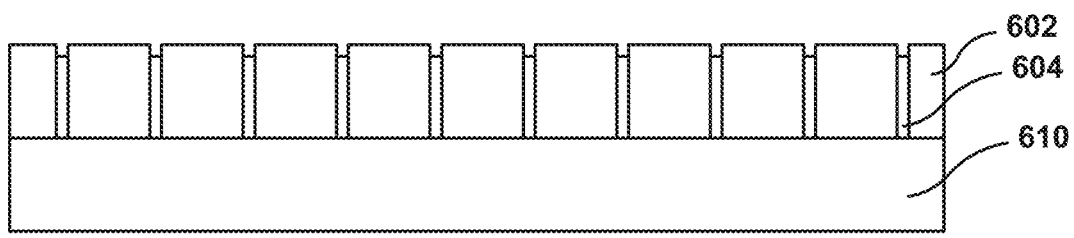
Figure 6D:
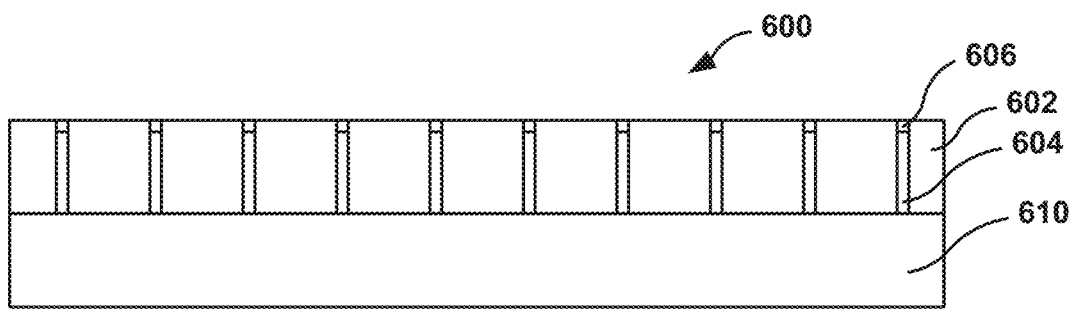

FIGS. 6A-6D are schematic conceptual diagrams illustrating example formation of a heating device according to techniques described herein. Referring to FIG. 6A, a substrate 602A is formed on a base substrate 610. For example, substrate 602A may be a metal layer or film, such as aluminum, while base substrate 610 may be a heat sink, such as silicon, configured to remove heat and quickly cool any contacting device, such as nanodevices described below. Referring to FIG. 6B, a plurality of pores 608 may be formed in porous substrate 602B. In some examples, substrate 602A may be anodized to form porous substrate 602B. For example, the metal layer of substrate 602A may be anodized to form a metal oxide of porous substrate 602B. Referring to FIG. 6C, a conductive or magnetic material may be deposited in the plurality of pores 608 to form a plurality of nanowires 604. For example, the conductive or magnetic material may be grown from base substrate 610 to a particular height within the plurality of pores 608. Referring to FIG. 6D, a solder material may be deposited in the remaining space within the plurality of pores 608 to form a plurality of solder nanoparticles 606 on the plurality of nanowires 604.

Figure 7A:
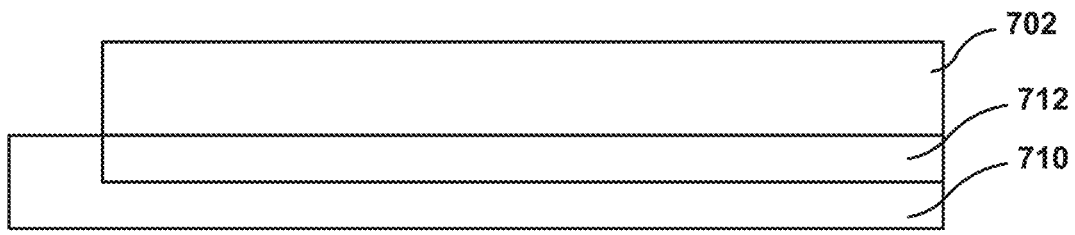
FIG. 7A-7E are schematic conceptual diagrams illustration example formation of an electronic device according to techniques described herein.
Figure 7B:
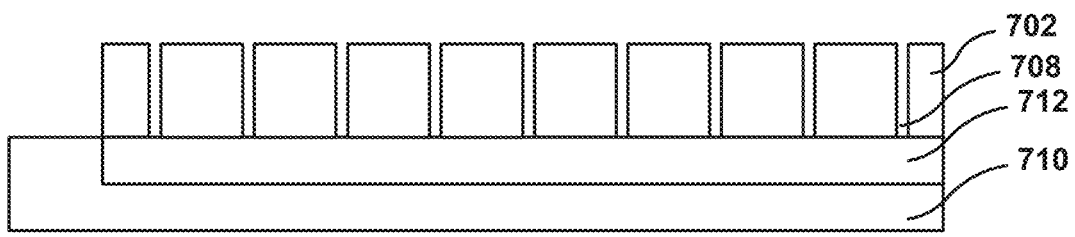
Figure 7C:
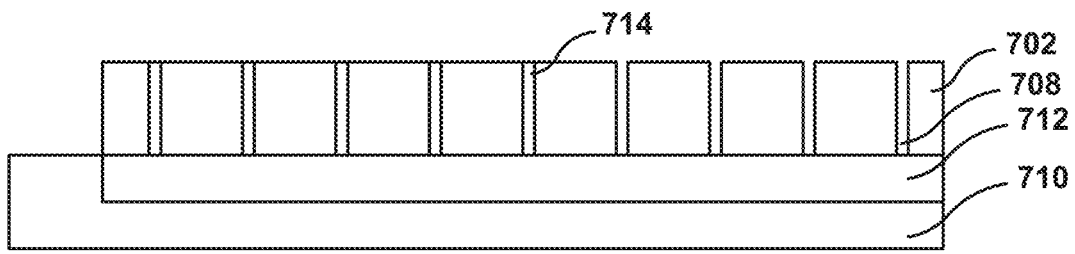
Figure 7D:
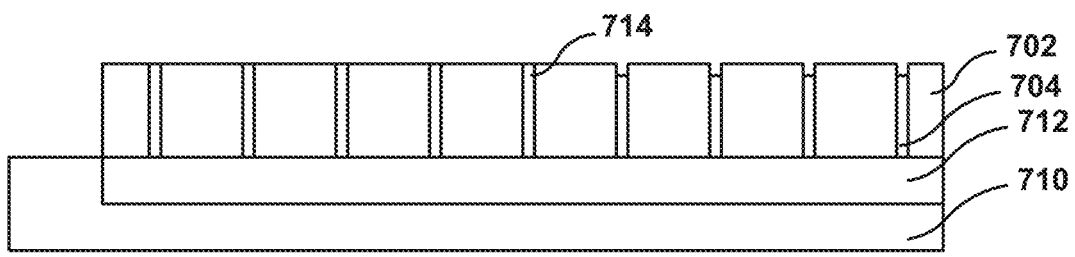
Figure 7E:
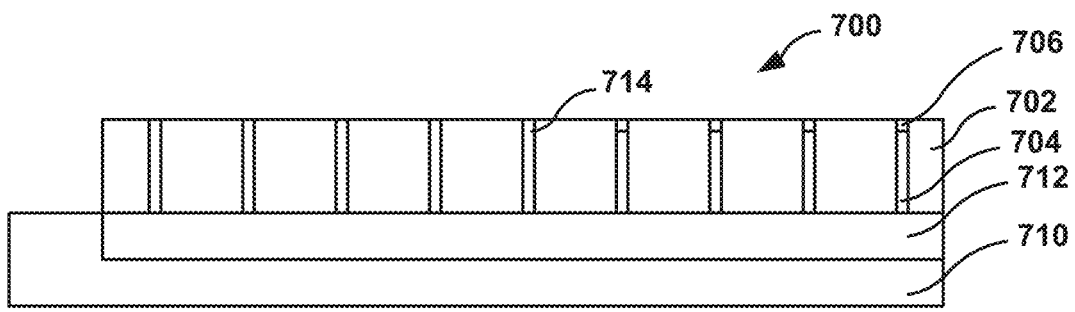
Figure 8A:
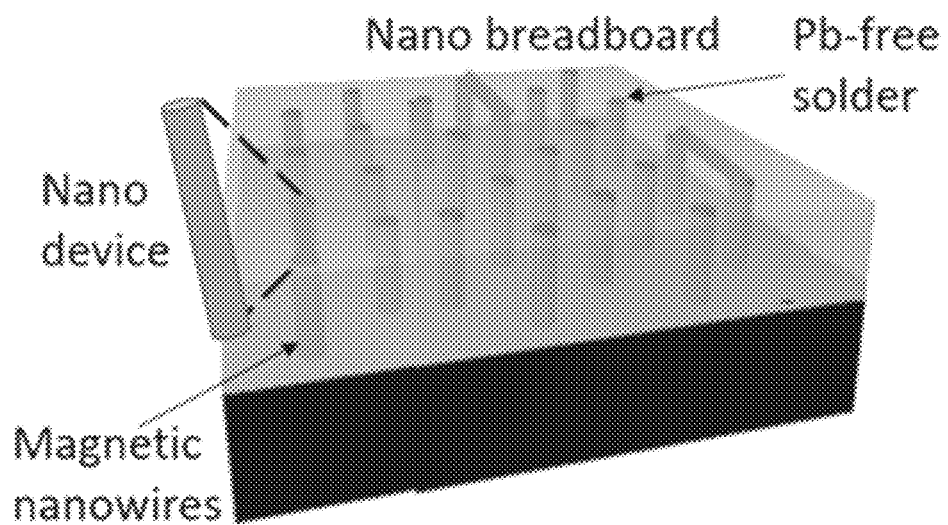
FIG. 8A is a schematic perspective view diagram of a breadboard used as a characterization system for nanodevices according to techniques described herein.
Figure 8B:
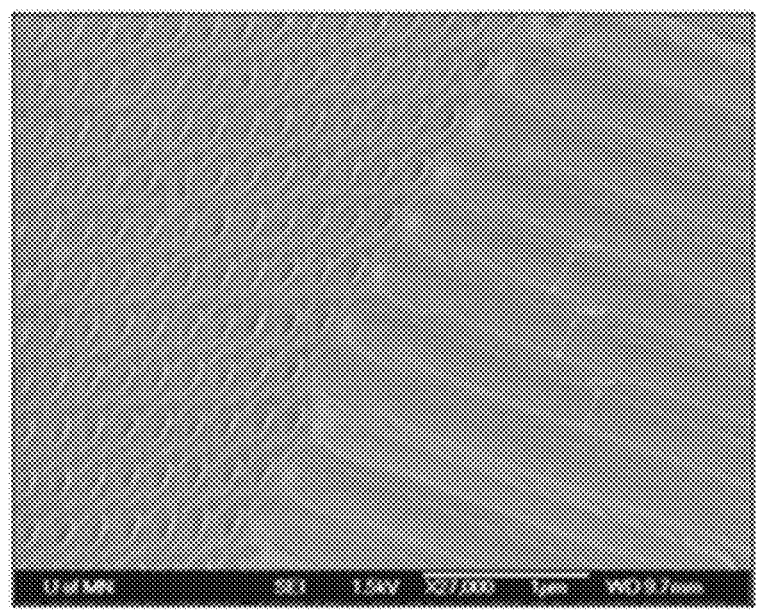
FIG. 8B is an SEM image of nanoporous aluminum oxide into which magnetic nanowires may be grown, according to techniques described herein.
Figure 8C:
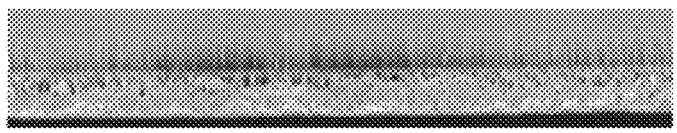
FIG. 8C is as SEM cross-section image of nanowires grown in a silicon substrate according to techniques described herein.

FIG. 7A-7E are schematic conceptual diagrams illustration example formation of an electronic device according to techniques described herein. Referring to FIG. 7A, a substrate 702A is formed on one or more patterned electrodes 712 on a base substrate 710. For example, substrate 702A may be a metal layer or film, such as aluminum, while patterned electrode 712 may be an electrical conductor or other interconnect of an electronic device and base substrate 710 may be a support, such as silicon. Referring to FIG. 7B, a plurality of pores 708 may be formed in porous substrate 702B. In some examples, substrate 702A may be anodized to form porous substrate 702B. For example, the metal layer of substrate 702A may be anodized to form a metal oxide of porous substrate 702B. Referring to FIG. 7C, a portion of the plurality of pores 708 may be blocked, such as by filling with a blocking material 714. For example, the blocking material may include photo-resist material or other material that may be selectively applied to particular pores at a relatively high resolution. Referring to FIG. 7D, a conductive or magnetic material may be deposited in the remaining plurality of open pores 708 to form a plurality of nanowires 704. For example, the conductive or magnetic material may be grown from patterned electrode 712 to a particular height within the plurality of pores 708. Referring to FIG. 7E, a solder material may be deposited in the remaining space within the plurality of open pores 708 to form a plurality of solder nanoparticles 706 on the plurality of nanowires 704. In other examples, such as illustrated in FIG. 2B, the conductive or magnetic material may be grown above a plane of porous substrate 702B, and solder nanoparticles 706 may be formed on or around the plurality of nanowires 704.

Example 1: A device includes an electronic device; a porous substrate on the electronic device, wherein the porous substrate defines a major top surface and comprises a plurality of pores; and a plurality of nanodevices positioned in at least a portion of the plurality of pores and oriented substantially perpendicular to the major surface of the porous substrate, wherein each of the plurality of nanodevices comprises: a nanowire; and a solder nanoparticle overlying the nanowire, wherein the nanowires of the plurality of nanodevices have an average diameter between about 10 nanometers and about 200 nanometers, such as less than about 20 nanometers, and wherein the solder nanoparticles of the plurality of nanodevices have an average diameter less than about 200 nanometers, such as between about 10 nanometers and about 200 nanometers.

Example 2: The device of example 1, wherein the nanowire comprises an electrically conductive material.

Example 3: The device of example 2, wherein the electrically conductive material comprises at least one of copper or gold.

Example 4: The device of any of examples 1 through 3, wherein the solder nanoparticles comprise at least one of tin, copper, silver, silicon, indium, zinc, or antimony.

Example 5: The device of any of examples 1 through 4, wherein the electronic device comprises a plurality of contacts configured to transmit electrical signals, and wherein each of the plurality of nanodevices comprises an interconnect configured to transmit the electrical signals from a contact of the plurality of contacts to another electronic device electrically coupled to the solder nanoparticle.

Example 6: The device of any of examples 1 through 5, wherein the nanowires have an average length-to-width aspect ratio that is greater than about 10.

Example 7: The device of any of examples 1 through 6, wherein the plurality of pores have an average diameter of between about 5 nanometers and about 15 nanometers.

Example 8: The device of any of examples 1 through 7, wherein the porous substrate comprises an oxide.

Example 9: The device of example 8, wherein the porous substrate comprises aluminum oxide.

Example 10: The device of any of examples 1 through 9, wherein a thermal conductivity of the porous substrate is less than a thermal conductivity of the nanowires.

Example 11: The device of any of examples 1 through 10, wherein the nanowires do not extend past a plane of the major surface of the porous substrate, and wherein the solder nanoparticles are positioned within the pores of the porous substrate.

Example 12: The device of example 12, wherein the solder nanoparticles have an average diameter less than about 20 nanometers.

Example 13: The device of any of examples 1 through 12, wherein the nanowires extend to or past a plane of the major surface of the porous substrate, and wherein the solder nanoparticles contact at least a portion of the corresponding nanowire extending to or past the plane of the major surface.

Example 14: The device of example 13, wherein the solder nanoparticles of the plurality of nanodevices have an average diameter less than about 100 nanometers.

Example 15: The device of any of examples 1 through 14, further comprising one or more connective nanodevices dispersed across the major surface of the porous substrate, wherein the one or more connective nanodevices are each configured to electrically couple to the solder nanoparticles of two or more nanodevices of the plurality of nanodevices in the porous substrate.

Example 16: A heating device includes a porous substrate comprising a plurality of pores; and a plurality of nanodevices dispersed in at least a portion of the plurality of pores, wherein each of the plurality of nanodevices comprises a magnetic nanowire, wherein the magnetic nanowires of the plurality of nanodevices have an average diameter less than about 20 nanometers, and wherein the magnetic nanowires are configured to generate heat in response to an alternating magnetic field.

Example 17: The heating device of example 16, wherein the magnetic nanowires have an average length-to-width aspect ratio that is greater than about 10.

Example 18: The heating device of any of examples 16 and 17, wherein the plurality of pores have an average diameter of between about 5 nanometers and about 15 nanometers.

Example 19: The heating device of any of examples 16 through 18, wherein the porous substrate comprises an oxide.

Example 20: The heating device of example 19, wherein the porous substrate comprises aluminum oxide.

Example 21: The heating device of any of examples 16 through 20, wherein a thermal conductivity of the porous substrate is less than a thermal conductivity of the magnetic nanowires.

Example 22: A heating system includes a heating device includes a porous substrate comprising a plurality of pores; and a plurality of nanodevices dispersed in at least a portion of the plurality of pores, wherein each of the plurality of nanodevices comprises a magnetic nanowire; and a magnetic device configured to generate an alternating magnetic field, wherein the magnetic nanowires of the plurality of nanodevices have an average diameter less than about 20 nanometers, and wherein the magnetic nanowires are configured to generate heat in response to the alternating magnetic field.

Example 23: The heating system of example 22, wherein the magnetic device comprises an oscilloscope.

Example 24: A method for generating localized heat includes applying an alternating magnetic field to a heating device, wherein the heating device comprises: a porous substrate comprising a plurality of pores; and a plurality of nanodevices dispersed in at least a portion of the plurality of pores, wherein each of the plurality of nanodevices comprises a magnetic nanowire, wherein the magnetic nanowires of the plurality of nanodevices have an average diameter less than about 20 nanometers, and wherein the magnetic nanowires generate the heat in response to the alternating magnetic field.

Example 25: A device includes an electronic device; a porous substrate on the electronic device, wherein the porous substrate defines a major surface and comprises a plurality of pores; and a plurality of nanodevices positioned in at least a portion of the plurality of pores and oriented substantially perpendicular to the major surface of the porous substrate, wherein each of the plurality of nanodevices comprises: a magnetic nanowire; and a solder nanoparticle overlying the nanowire, wherein the magnetic nanowires of the plurality of nanodevices are configured to generate heat in response to an alternating magnetic field and transfer at least a portion of the heat to the solder nanoparticles of the plurality of nanodevices.

Example 26: The device of example 25, wherein the array of solder nanoparticles comprise at least one of tin, copper, silver, silicon, indium, zinc, or antimony.

Example 27: The device of any of examples 25 and 26, wherein the solder nanoparticles comprise solder nanodots.

Example 28: The device of any of examples 25 through 27, wherein the solder nanoparticles have an average diameter between about 10 nanometers and about 200 nanometers.

Example 29: The device of any of examples 25 through 28, wherein the nanowires do not extend past a plane of the major surface of the porous substrate, and wherein the solder nanoparticles are positioned within the pores of the porous substrate.

Example 30: The device of example 29, wherein the solder nanoparticles have an average diameter less than about 20 nanometers.

Example 31: The device of any of examples 25 through 30, wherein the nanowires extend to or past a plane of the major surface of the porous substrate, and wherein the solder nanoparticles contact at least a portion of the corresponding nanowire extending to or past the plane of the major surface.

Example 32: The device of example 31, wherein the solder nanoparticles of the plurality of nanodevices have an average diameter less than about 100 nanometers.

Example 33: The device of any of examples 25 through 32, further comprising one or more connective nanodevices dispersed across the major surface of the porous substrate, wherein the one or more connective nanodevices are each configured to electrically couple to the solder nanoparticles of two or more nanodevices of the plurality of nanodevices in the porous substrate.

Example 34: A method for reflowing an array of solder nanoparticles includes applying an alternating magnetic field to a device, wherein the device comprises: an electronic device; a porous substrate on the electronic device, wherein the porous substrate defines a major surface and comprises a plurality of pores; and a plurality of nanodevices positioned in at least a portion of the plurality of pores and oriented substantially perpendicular to the major surface of the porous substrate, wherein each of the plurality of nanodevices comprises: a magnetic nanowire; and a solder nanoparticle overlying the nanowire, wherein the magnetic nanowires generate heat in response to the alternating magnetic field and transfer at least a portion of the heat to the solder nanoparticles.

Example 35: An electronic system includes a device includes a first electronic device includes a magnetic nanowire electrically connected to at least one electrical contact; and a solder nanoparticle overlying the magnetic nanowire; and a second electronic device comprising one or more contact pads; wherein the magnetic nanowires are electrically coupled to the second electronic device through the solder nanoparticles.

Example 36: The electronic system of example 35, wherein the magnetic nanowires are configured to expand in response to generating the heat.

Example 37: The electronic system of any of examples 35 and 36, wherein the magnetic nanowires have a coefficient of thermal expansion greater than about 5 parts per million (ppm) per degree Kelvin (K).

Example 38: A method for reflowing an array of solder nanoparticles includes applying an alternating magnetic field to a device, wherein the device comprises: an electronic device; a porous substrate on the electronic device, wherein the porous substrate defines a major surface and comprises a plurality of pores; and a plurality of nanodevices positioned in at least a portion of the plurality of pores and oriented substantially perpendicular to the major surface of the porous substrate, wherein each of the plurality of nanodevices comprises: a magnetic nanowire; and a solder nanoparticle overlying the nanowire, wherein the magnetic nanowires generate heat in response to the alternating magnetic field and transfer at least a portion of the heat to the solder nanoparticles.

Example 39: An electronic system includes a device includes a first electronic device includes a magnetic nanowire electrically connected to at least one electrical contact; and a solder nanoparticle overlying the magnetic nanowire; and a second electronic device comprising one or more contact pads; wherein the magnetic nanowires are electrically coupled to the second electronic device through the solder nanoparticles.

Example 40: The electronic system of example 39, wherein the magnetic nanowires are configured to expand in response to generating the heat.

Example 41: The electronic system of any of examples 39 and 40, wherein the magnetic nanowires have a coefficient of thermal expansion greater than about 5 parts per million (ppm) per degree Kelvin (K).

Example 42: A method for electrically coupling an electronic system includes applying an alternating magnetic field to a device, wherein the device comprises: a first electronic device includes a nanowire electrically connected to at least one electrical contact; and a solder nanoparticle overlying the nanowire, wherein the magnetic nanowires of the plurality of nanodevices generate heat in response to an alternating magnetic field and transfer at least a portion of the heat to the solder nanoparticles to reflow the solder nanoparticles and electrically couple the first electronic device to a second electronic device through the reflowed solder nanoparticles.

Example 43: A nanodevice characterization system includes a probing device includes a porous substrate defining a major surface and includes a magnetic nanowire; and a solder nanoparticle overlying the nanowire; and a measurement device electrically coupled to the plurality of probing nanodevices, wherein the major surface of the probing device is configured to receive one or more target nanodevices, and wherein the magnetic nanowires of the plurality of probing nanodevices are configured to generate heat in response to an alternating magnetic field and transfer at least a portion of the heat to the solder nanoparticles of the plurality of probing nanodevices to reflow the solder nanoparticles and electrically couple at least a portion of the magnetic nanowires to at least one target nanodevice.

Example 44: The nanodevice characterization system of example 43, wherein the measurement device comprises an oscilloscope.

Example 45: A method for characterizing a nanodevice includes dispersing one or more target nanodevices on a major surface of a probing device, wherein the probing device comprises: a porous substrate that includes a plurality of pores and defines the major surface of the heating device; and a plurality of probing nanodevices positioned in at least a portion of the plurality of pores and oriented substantially perpendicular to the major surface of the porous substrate, wherein each of the plurality of probing nanodevices comprises: a magnetic nanowire; and a solder nanoparticle overlying the magnetic nanowire; applying an alternating magnetic field to the probing device to generate heat in response to an alternating magnetic field and transfer at least a portion of the heat to the solder nanoparticles of the plurality of probing nanodevices to reflow the solder nanoparticles and electrically couple at least a portion of the magnetic nanowires to at least one target nanodevice; and measuring one or more properties of the at least one target nanodevice.

Example 46: The method of example 45, wherein the one or more target nanodevices include a magnetic portion, and wherein the magnetic portion of the one or more target nanodevices are magnetically coupled to the plurality of magnetic nanowires to align the one or more nanodevices on the heating device.

Example 47: A method of forming a device includes forming a plurality of nanodevices in at least a portion of a plurality of pores of a porous substrate, wherein the plurality of pores has an average diameter less than about 20 nanometers, and wherein each of the plurality of nanodevices comprises: a nanowire; and a solder nanoparticle overlying the nanowire.

Example 48: The method of example 47, wherein forming the plurality of nanodevices comprises depositing a conductive material in the plurality of pores to form the nanowires.

Example 49: The method of example 48, wherein the conductive material is deposited using electrochemical deposition.

Example 50: The method of any of examples 48 and 49, wherein the nanowires do not extend past a plane of the major surface of the porous substrate, wherein forming the plurality of nanodevices comprises depositing a solder material in the plurality of pores on the nanowires to form the solder nanoparticles.

Example 51: The method of example 50, wherein the solder nanoparticles have an average diameter between about 10 nanometers and about 200 nanometers.

Example 52: The method of any of examples 50 and 51, wherein the solder material is deposited using electrochemical deposition.

Example 53: The method of any of examples 48 through 52, wherein the nanowires extend to or past a plane of the major surface of the porous substrate, and wherein forming the plurality of nanodevices further comprises: depositing a solder material on the major surface of the porous substrate; and removing a portion of the solder material from the major surface to form the solder nanoparticles, wherein the solder nanoparticles contact at least a portion of the corresponding nanowire extending to or past the plane of the major surface.

Example 54: The method of example 53, wherein the solder nanoparticles of the plurality of nanodevices have an average diameter less than about 100 nanometers.

Example 55: The method of any of examples 47 through 54, further comprising forming the porous substrate on one or more patterned electrodes of an electronic device.

Example 56: The method of example 55, wherein forming the porous substrate further comprises: forming a metal layer on the one or more patterned electrodes; and anodizing the metal layer to form a metal oxide that includes the plurality of pores.

Example 57: The method of example 56, wherein the metal layer comprises aluminum, and wherein the metal oxide comprises aluminum oxide.

Example 58: The method of any of examples 47 through 57, further includes dispersing one or more connective nanodevices across a major surface of the porous substrate; and electrically coupling each of the one or more connective nanodevices to the solder nanoparticles of two or more nanodevices of the plurality of nanodevices in the porous substrate.

Example 59: A method for forming a heating device includes forming a plurality of nanodevices in at least a portion of a plurality of pores of a porous substrate, wherein the plurality of pores have an average diameter less than about 20 nanometers, wherein each of the plurality of nanodevices comprises a magnetic nanowire, and wherein the magnetic nanowires are configured to generate heat in response to an alternating magnetic field.

Example 60: The method of example 59, wherein forming the plurality of nanodevices further comprises depositing a magnetic material in the plurality of pores to form the magnetic nanowires.

Example 61: The method of example 60, wherein the magnetic material is deposited using electrochemical deposition.

Example 62: The method of any of examples 59 through 61, further comprising forming the porous substrate.

Example 63: The method of example 62, wherein forming the porous substrate further comprises: forming a metal layer on a surface of a base substrate; and anodizing the metal layer to form a metal oxide that includes the plurality of pores.

Example 64: The method of example 63, wherein the metal layer comprises aluminum, and wherein the metal oxide comprises aluminum oxide.

Example 65: The method of any of examples 63 and 64, wherein the base substrate comprises silicon.

Various examples have been described. These and other examples are within the scope of the following claims.

The invention claimed is:

1. A device, comprising:
an electronic device;
a porous substrate on the electronic device, wherein the porous substrate defines a major surface and comprises a plurality of pores; and
a plurality of nanodevices positioned in at least a portion of the plurality of pores and oriented substantially perpendicular to the major surface of the porous substrate, wherein each of the plurality of nanodevices comprises:
a magnetic nanowire; and
a solder nanoparticle overlying the nanowire,
wherein the magnetic nanowires of the plurality of nanodevices are configured to generate heat in response to an alternating magnetic field and transfer at least a portion of the heat to the solder nanoparticles of the plurality of nanodevices.

2. The device of claim 1, wherein the plurality of nanodevices includes:
a first nanodevice comprising a first magnetic nanowire defining a first hysteresis loop having a first threshold magnetic field amplitude, and
a second nanodevice comprising a second magnetic nanowire defining a second hysteresis loop having a second threshold magnetic field amplitude, different from the first hysteresis loop and the first threshold magnetic field amplitude.

3. The device of claim 2, wherein a diameter of the first magnetic nanowire is different from a diameter of the second magnetic nanowire.

4. The device of claim 2, wherein a composition of the first magnetic nanowire is different from a composition of the second magnetic nanowire.

5. The device of claim 1, wherein the solder nanoparticles comprise at least one of tin, copper, silver, silicon, indium, zinc, or antimony.

6. The device of claim 1, wherein the solder nanoparticles comprise solder nanodots.

7. The device of claim 1, wherein the solder nanoparticles have an average diameter between about 10 nanometers and about 200 nanometers.

8. The device of claim 1,
wherein the magnetic nanowires do not extend past a plane of the major surface of the porous substrate, and
wherein the solder nanoparticles are positioned within the pores of the porous substrate.

9. The device of claim 8, wherein the solder nanoparticles have an average diameter less than about 20 nanometers.

10. The device of claim 1,
wherein the magnetic nanowires extend to or past a plane of the major surface of the porous substrate, and wherein the solder nanoparticles contact at least a portion of the corresponding magnetic nanowire extending to or past the plane of the major surface.

11. The device of claim 10, wherein the solder nanoparticles of the plurality of nanodevices have an average diameter less than about 100 nanometers.

12. The device of claim 1, further comprising one or more connective nanodevices dispersed across the major surface of the porous substrate, wherein the one or more connective nanodevices are each configured to electrically couple to the solder nanoparticles of two or more nanodevices of the plurality of nanodevices in the porous substrate.

13. The device of claim 1, wherein the magnetic nanowire comprises an electrically conductive material.

14. The device of claim 13, wherein the electrically conductive material comprises at least one of copper or gold.

15. The device of claim 1,
wherein the electronic device comprises a plurality of contacts configured to transmit electrical signals, and
wherein each of the plurality of nanodevices comprises an interconnect configured to transmit the electrical signals from a contact of the plurality of contacts to another electronic device electrically coupled to the solder nanoparticle.

16. The device of claim 1, wherein the magnetic nanowires have an average length-to-width aspect ratio that is greater than about 10.

17. The device of claim 1, wherein the porous substrate comprises aluminum oxide.

18. The device of claim 1, wherein a thermal conductivity of the porous substrate is less than a thermal conductivity of the nanowires.

19. A device, comprising:
a porous substrate configured to couple to an electronic device, wherein the porous substrate defines a major surface and comprises a plurality of pores; and
a plurality of nanodevices positioned in at least a portion of the plurality of pores and oriented substantially perpendicular to the major surface of the porous substrate, wherein each of the plurality of nanodevices comprises:
a magnetic nanowire; and
a solder nanoparticle overlying the nanowire,
wherein the magnetic nanowires of the plurality of nanodevices are configured to generate heat in response to an alternating magnetic field and transfer at least a portion of the heat to the solder nanoparticles of the plurality of nanodevices.

20. A method for reflowing an array of solder nanoparticles, comprising:
applying an alternating magnetic field to a device, wherein the device comprises:
an electronic device;
a porous substrate on the electronic device, wherein the porous substrate defines a major surface and comprises a plurality of pores; and
a plurality of nanodevices positioned in at least a portion of the plurality of pores and oriented substantially perpendicular to the major surface of the porous substrate, wherein each of the plurality of nanodevices comprises:
a magnetic nanowire; and
a solder nanoparticle overlying the nanowire,
wherein the magnetic nanowires generate heat in response to the alternating magnetic field and transfer at least a portion of the heat to the solder nanoparticles.

* * * * *